(12) United States Patent
In

(10) Patent No.: US 11,552,135 B2
(45) Date of Patent: Jan. 10, 2023

(54) DISPLAY DEVICE INCLUDING INPUT SENSING UNIT AND DRIVING METHOD THEREOF

(71) Applicant: Samsung Display Co., Ltd., Yongin-si (KR)

(72) Inventor: Hai-Jung In, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/820,455

(22) Filed: Mar. 16, 2020

(65) Prior Publication Data
US 2020/0303468 A1 Sep. 24, 2020

(30) Foreign Application Priority Data

Mar. 19, 2019 (KR) .......................... 10-2019-0031308

(51) Int. Cl.
*G09G 3/3225* (2016.01)
*H01L 27/32* (2006.01)

(52) U.S. Cl.
CPC ......... *H01L 27/323* (2013.01); *G09G 3/3225* (2013.01); *H01L 27/3276* (2013.01); *G09G 2310/0286* (2013.01); *G09G 2310/08* (2013.01)

(58) Field of Classification Search
CPC . H01L 27/323; H01L 27/3276; G09G 3/3225; G09G 2310/08; G09G 2310/0286; G09G 2310/0281; G09G 2310/0267; G09G 2300/0426; G09G 3/3208; G06F 3/0412; G06F 3/0414; G06F 3/046
See application file for complete search history.

(56) References Cited

U.S. PATENT DOCUMENTS

| 9,330,593 | B2 | 5/2016 | Jang | |
| 2005/0078057 | A1* | 4/2005 | Chang | ................. G02F 1/13454 |
| | | | | 345/55 |
| 2008/0018613 | A1* | 1/2008 | Kim | ....................... G06F 3/047 |
| | | | | 345/173 |
| 2016/0098141 | A1* | 4/2016 | Kang | .................... G06F 1/3265 |
| | | | | 345/174 |
| 2016/0224177 | A1 | 8/2016 | Krah | |
| 2016/0320886 | A1* | 11/2016 | Kim | ........................ G06F 3/047 |

(Continued)

FOREIGN PATENT DOCUMENTS

KR 10-2018-0069365 6/2018
KR 10-2018-0112185 10/2018

*Primary Examiner* — Carolyn R Edwards
(74) *Attorney, Agent, or Firm* — H.C. Park & Associates, PLC

(57) ABSTRACT

A display device includes a display panel, an input sensing unit, input sensing pads, a shift register, and a multiplexer circuit. The display panel includes a display area and a non-display area. The input sensing unit is disposed on the display panel. The input sensing unit includes sensing electrodes and signal lines respectively connected to the sensing electrodes. The input sensing pads are disposed in the non-display area. The input sensing pads include control signal pads and a sensing pad. The shift register array is configured to receive a start signal and at least one clock signal through some of the control signal pads, and to sequentially activate first selection signals. The multiplexer circuit is configured to selectively connect the signal lines to the sensing pad in response to the first selection signals.

22 Claims, 28 Drawing Sheets

(56) References Cited

U.S. PATENT DOCUMENTS

| | | | |
|---|---|---|---|
| 2017/0052614 A1* | 2/2017 | Hsiao | G09G 3/20 |
| 2017/0345366 A1 | 11/2017 | Jang | |
| 2018/0182333 A1 | 6/2018 | Ahn et al. | |
| 2018/0261147 A1* | 9/2018 | Lin | G06F 3/0412 |
| 2018/0284926 A1* | 10/2018 | Kim | G06F 3/04164 |
| 2019/0146618 A1* | 5/2019 | Chen | G09G 3/20 345/173 |
| 2019/0204944 A1* | 7/2019 | Jun | G06F 3/0412 |
| 2019/0286268 A1* | 9/2019 | Lin | G06F 3/0412 |

* cited by examiner

DISPLAY DEVICE INCLUDING INPUT SENSING UNIT AND DRIVING METHOD THEREOF

CROSS-REFERENCE TO RELATED APPLICATION

This application claims priority to and the benefit of Korean Patent Application No. 10-2019-0031308, filed Mar. 19, 2019, which is hereby incorporated by reference for all purposes as if fully set forth herein.

BACKGROUND

Field

Exemplary embodiments generally relate to a display device including an input sensing unit and a driving method of the display device.

Discussion

Various display devices may be used for multi-media devices, such as televisions, mobile phones, tablet computers, navigations, game consoles, etc. The display devices may include an input sensing unit capable of providing a touch-based input method that allows a user to easily input information or commands intuitively and conveniently in addition to a typical input method, such as a button, a keyboard, a mouse, or the like.

The above information disclosed in this section is only for understanding the background of the inventive concepts, and, therefore, may contain information that does not form prior art.

SUMMARY

Some exemplary embodiments provide a display device capable of reducing the number of pads connected to an input sensing unit.

Additional aspects will be set forth in the detailed description which follows, and, in part, will be apparent from the disclosure, or may be learned by practice of the inventive concepts.

According to some exemplary embodiments, a display device includes a display panel, an input sensing unit, input sensing pads, a shift register array, and a multiplexer circuit. The display panel includes a display area and a non-display area. The input sensing unit is disposed on the display panel. The input sensing unit includes sensing electrodes and signal lines respectively connected to the sensing electrodes. The input sensing pads are disposed in the non-display area. The input sensing pads include control signal pads and a sensing pad. The shift register array is configured to receive a start signal and at least one clock signal through some of the control signal pads, and to sequentially activate first selection signals. The multiplexer circuit is configured to selectively connect the signal lines to the sensing pad in response to the first selection signals.

According to some exemplary embodiments, a method of driving a display device, which includes a display panel; an input sensing unit disposed on the display panel, the input sensing unit including sensing electrodes and signal lines respectively connected to the sensing electrodes; and pads including control signal pads and a sensing pad, includes: receiving a start signal and at least one clock signal through some of the control signal pads; sequentially activating first selection signals; and selectively connecting the signal lines to the sensing pad in response to the first selection signals.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts. In the drawings.

DETAILED DESCRIPTION OF SOME EXEMPLARY EMBODIMENTS

Figure 1:
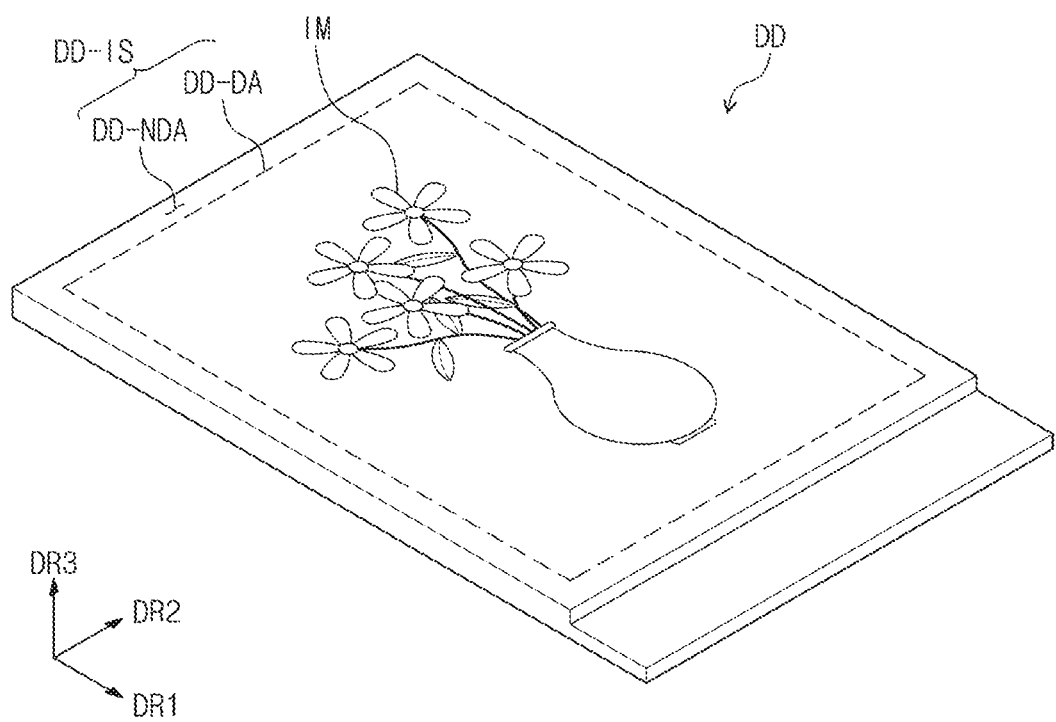
FIG. 1 is a perspective view of a display device according to some exemplary embodiments.

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

FIG. 1 is a perspective view of a display device according to some exemplary embodiments.

As shown in FIG. 1, a display device DD may display an image IM through a display surface DD-IS. The display surface DD-IS is parallel to the plane defined by the first directional axis DR1 and the second directional axis DR2. The normal direction of the display surface DD-IS, that is, a thickness direction of the display device DD, is indicated by a third direction axis DR3.

The front surface (or the upper surface) and the back surface (or lower surface) of each of the members, units, etc., described below are distinguished by way of the third direction axis DR3. However, the first to third direction axes DR1, DR2, and DR3 are merely examples and the directions indicated by the first to third direction axis DR1, DR2, and DR3 may be converted into other directions as relative concepts. Hereinafter, the first to third directions refer to the same reference numerals as the directions indicated by the first to third direction axes DR1, DR2, and DR3, respectively.

In some exemplary embodiments, the display device DD has a planar display surface as shown, but exemplary embodiments are not limited thereto. The display device DD may include a curved display surface, a stereoscopic display surface, etc. The stereoscopic display surface may include a plurality of display areas indicating different directions, and may include, for example, a polygonal columnar display surface.

The display device DD according to some exemplary embodiments may be a rigid display device. However, exemplary embodiments are not limited thereto, and the display device DD according to some exemplary embodiments may be a flexible display device DD or include at least one flexible region. In some exemplary embodiments, the display device DD may be applied to (or used in association with) a mobile phone terminal, as is exemplarily shown. Although not shown in the drawings, electronic modules, camera modules, and power modules mounted on a main board may be disposed in a bracket and/or case together with the display device DD to constitute a mobile phone terminal. The display device DD according to some exemplary embodiments may be applied to small and medium-sized electronic devices such as tablets, car navigation units, game consoles, smart watches, etc., in addition to being employed in association with large-sized electronic devices, such as televisions, monitors, billboards, appliances, etc.

As shown in FIG. 1, the display surface DD-IS includes a display area DD-DA where the image IM is displayed and a non-display area DD-NDA adjacent to (e.g., outside) the display area DD-DA. The non-display area DD-NDA is an area where no image is displayed. FIG. 1 illustrates a vase as one example of the image IM, but exemplary embodiments are not limited thereto.

As shown in FIG. 1, the display area DD-DA may have a rectangular form. The non-display area DD-NDA may be in a form surrounding the display area DD-DA. However, exemplary embodiments are not limited thereto, and a form of the display area DD-DA and a form of the non-display area DD-NDA may be designed relatively.

Figure 2:
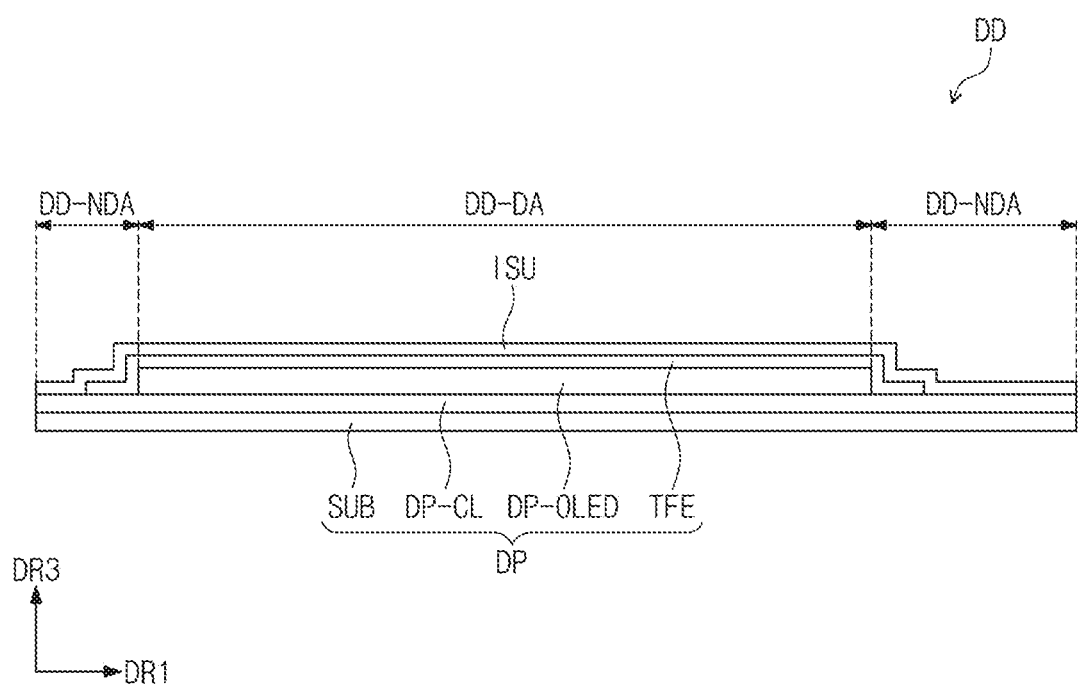
FIG. 2 is a cross-sectional view of a display device according to some exemplary embodiments.

FIG. 2 is a cross-sectional view of a display device according to some exemplary embodiments.

Referring to FIG. 2, the display device DD includes a display panel DP and an input sensing unit ISU, as shown in FIG. 2. Although not shown separately, the display device DD according to some exemplary embodiments may further include a protection member disposed on the lower surface of the display panel DP, an anti-reflection member, and/or a window member disposed on the upper surface of the input sensing unit ISU.

The display panel DP may be a light-emitting display panel, but is not particularly limited. For example, the display panel DP may be an organic light emitting display panel, a quantum dot light emitting display panel, etc. In the organic light emitting display panel, the light emitting layer includes an organic light emitting material. In the quantum dot light emitting display panel, the light emitting layer includes quantum dots and/or quantum rods. Hereinafter, the display panel DP is described as an organic light emitting display panel.

The display panel DP includes a base layer SUB, a circuit element layer DP-CL disposed on the base layer SUB, a display element layer DP-OLED, and a thin film sealing layer TFE. Although not shown separately, the display panel DP may further include one or more functional layers, such as an anti-reflection layer, a refractive index control layer, etc.

The base layer SUB may include at least one plastic film. The base layer SUB may include a plastic substrate, a glass substrate, a metal substrate, and/or an organic/inorganic composite material substrate. The base layer SUB may be a flexible substrate. The display area DD-DA and the non-display area DD-NDA described with reference to FIG. 1 may be defined equally in association with the base layer SUB.

Although not shown in FIG. 2, the circuit element layer DP-CL includes at least one intermediate insulating layer and circuit elements. The intermediate insulating layer includes at least one intermediate inorganic film and at least one intermediate organic film. Although not shown in FIG. 2, the circuit element includes signal lines, a driving circuit of a pixel, and the like. Detailed description for these features will be made later.

Although not shown in FIG. 2, the display element layer DP-OLED includes at least one organic light emitting diode. The display element layer DP-OLED may further include an organic layer, such as a pixel defining layer.

The thin film sealing layer TFE seals the display element layer DP-OLED. The thin film sealing layer TFE includes at least one inorganic film (hereinafter, referred to as a sealing inorganic film). The thin film sealing layer TFE may further include at least one organic film (hereinafter, referred to as a sealing organic film). The sealing inorganic film protects the display element layer DP-OLED from moisture and/or oxygen, and the sealing organic film protects the display element layer DP-OLED from foreign substances, such as dust particles. The sealing inorganic layer may include at least one of a silicon nitride layer, a silicon oxynitride layer, a silicon oxide layer, a titanium oxide layer, and an aluminum oxide layer. The sealing organic layer may include an acryl-based organic layer, but exemplary embodiments are not limited thereto.

The input sensing unit ISU obtains the coordinate information of an input interaction, e.g., external input. The input sensing unit ISU may be formed on the display panel DP by a continuous process without the use of an adhesive member, or at least some of the components may be coupled to each other through an adhesive member.

The input sensing unit ISU may have a multilayer structure. The input sensing unit ISU may include a single layer or a multilayer conductive layer. The input sensing unit ISU may include a single layer or a multilayer insulating layer.

The input sensing unit ISU may detect the external input, for example, in a capacitive manner. However, an operating method of the input sensing unit ISU is not limited thereto, and according to some exemplary embodiments, the input sensing unit ISU may detect an external input through an electromagnetic induction method, a pressure sensing method, or any other suitable sensing method.

Figure 3A:
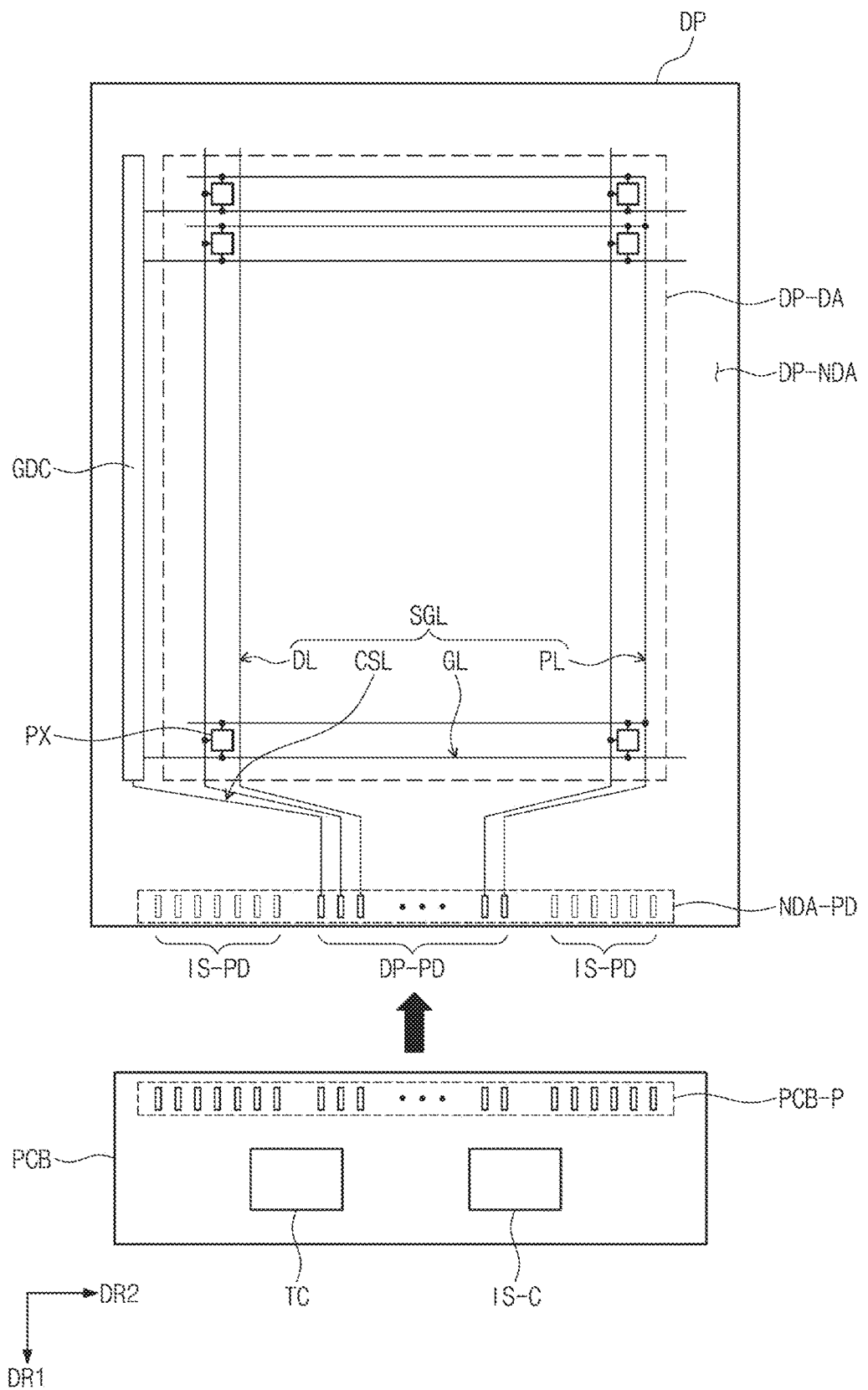
FIGS. 3A and 3B are plan views of a display panel according to some exemplary embodiments.
Figure 3B:
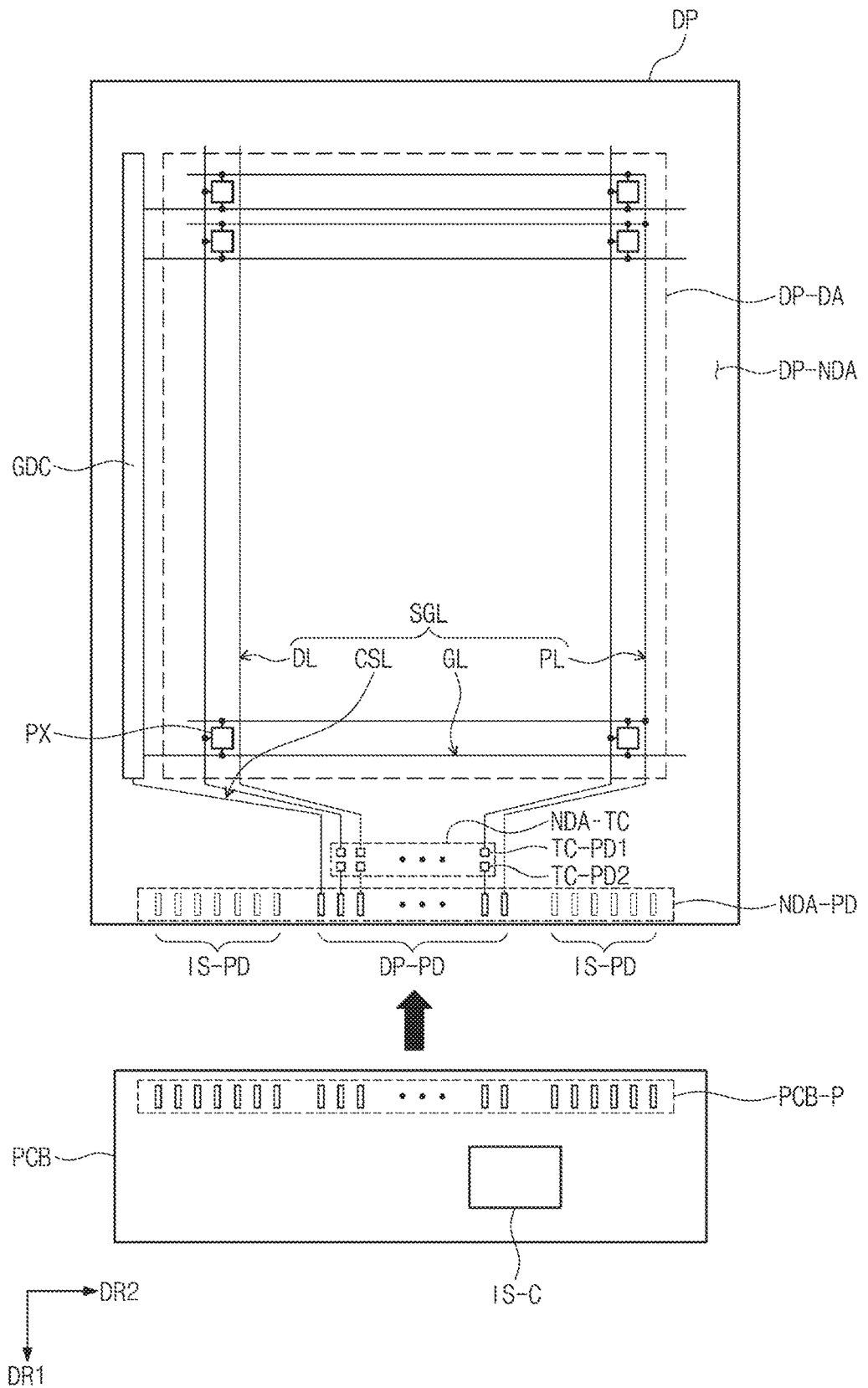

FIGS. 3A and 3B are plan views of a display panel according to some exemplary embodiments.

As shown in FIG. 3A, the display panel DP includes a display area DP-DA and a non-display area DP-NDA on a plane. In some exemplary embodiments, the non-display area DP-NDA may be defined along the outline of the display area DP-DA. The display area DP-DA and the non-display area DP-NDA of the display panel DP may correspond to the display area DD-DA and the non-display area DD-NDA of the display device DD shown in FIGS. 1 and 2A, respectively.

The display panel DP may include a driving circuit GDC, a plurality of signal lines SGL (hereinafter, referred to as signal lines), a plurality of signal pads DP-PD (hereinafter, referred to as signal pads), and a plurality of pixels PX (hereinafter, referred to as pixels). The pixels PX are disposed in the display area DP-DA. Although not shown in FIGS. 3A and 3B, each of the pixels PX may include an organic light emitting diode and a pixel driving circuit connected thereto. The driving circuit GDC, the signal lines SGL, the signal pads DP-PD, and the pixel driving circuit may be included in the circuit element layer DP-CL shown in FIG. 2.

The driving circuit GDC may include a scan driving circuit. The scan driving circuit generates a plurality of scan signals (hereinafter, referred to as scan signals), and sequentially outputs the scan signals to a plurality of scan lines GL (hereinafter, referred to as scan lines) described later. The scan driving circuit may further output another control signal to the driving circuit of the pixels PX.

Although not shown in FIGS. 3A and 3B, the driving circuit GDC may include a plurality of thin film transistors formed through the same process as the driving circuit of the pixels PX, for example, a low temperature polycrystalline silicon (LTPS) process or a low temperature polycrystalline oxide (LTPO) process.

The signal lines SGL include scan lines GL, data lines DL, a power supply line PL, and a control signal line CSL. The scan lines GL are respectively connected to corresponding pixels PX among the pixels PX, and the data lines DL are respectively connected to corresponding pixels PX among the pixels PX. The power supply line PL is connected to the pixels PX. The control signal line CSL may provide control signals to the driving circuit GDC.

The signal lines SGL overlap the display area DP-DA and the non-display area DP-NDA. The signal lines SGL may include a pad part and a line part. The line part overlaps the display area DP-DA and the non-display area DP-NDA. The pad part is connected to the end of the line part. The pad part is disposed in the non-display area DP-NDA and overlaps the corresponding signal pad among the signal pads DP-PD. The area where the signal pads DP-PD are disposed in the non-display area DP-NDA may be defined as the pad area NDA-PD.

A line part substantially connected to the pixel PX constitutes most of the signal lines SGL. The line part is connected to the transistors (not shown) of the pixel PX. The line part may have a single layer or multilayer structure, and the line part may be a single body or may include two or more parts. The two or more parts may be disposed on different layers and may be connected to each other through a contact hole passing through an insulating layer disposed between the two or more parts.

The display panel DP may further include input sensing pads IS-PD disposed in the pad area NDA-PD. Since the input sensing pads IS-PD may be formed through the same process as the signal lines SGL, they may be disposed on the same layer as the signal lines SGL.

The input sensing pads IS-PD may overlap the pad part of the signal lines provided in the input sensing unit ISU shown in FIG. 2. The input sensing pads IS-PD may be electrically isolated from the signal lines SGL of the display panel DP.

FIG. 3A additionally shows a circuit board PCB electrically connected to the display panel DP. The circuit board PCB may be a rigid circuit board or a flexible circuit board. The circuit board PCB may be directly coupled to the display panel DP or connected to the display panel DP through another circuit board.

A timing control circuit TC for controlling the operation of the display panel DP may be disposed in the circuit board PCB. In addition, an input sensing circuit IS-C for controlling the input sensing unit ISU may be disposed on the circuit board PCB. Each of the timing control circuit TC and the input sensing circuit IS-C may be mounted on the circuit board PCB in the form of an integrated chip. In some exemplary embodiments, the timing control circuit TC and the input sensing circuit IS-C may be mounted on the circuit board PCB in the form of a single integrated chip. The circuit board PCB may include circuit board pads PCB-P electrically connected to the display panel DP. Although not shown in the drawings, the circuit board PCB further includes signal lines connecting the circuit board pads PCB-P with the timing control circuit TC and/or the input sensing circuit IS-C.

As shown in FIG. 3B, the display panel DP according to some exemplary embodiments may further include a chip mounting area NDA-TC disposed in the non-display area DP-NDA. A chip-type timing control circuit TC (hereinafter, referred to as a control circuit chip) is mounted in the chip mounting area NDA-TC.

The first chip pads TC-PD1 and the second chip pads TC-PD2 may be disposed in the chip mounting area NDA-TC. The first chip pads TC-PD1 may be connected to the data lines DL and the second chip pads TC-PD2 may be connected to the signal pads DP-PD through the signal lines. The terminals of the timing control circuit TC may be connected to the first chip pads TC-PD1 and the second chip pads TC-PD2. As a result, the data lines DL may be electrically connected to the signal pads DP-PD through the timing control circuit TC.

In some exemplary embodiments, at least one of the control signal line CSL and the power supply line PL may be connected to the timing control circuit TC.

Figure 4:
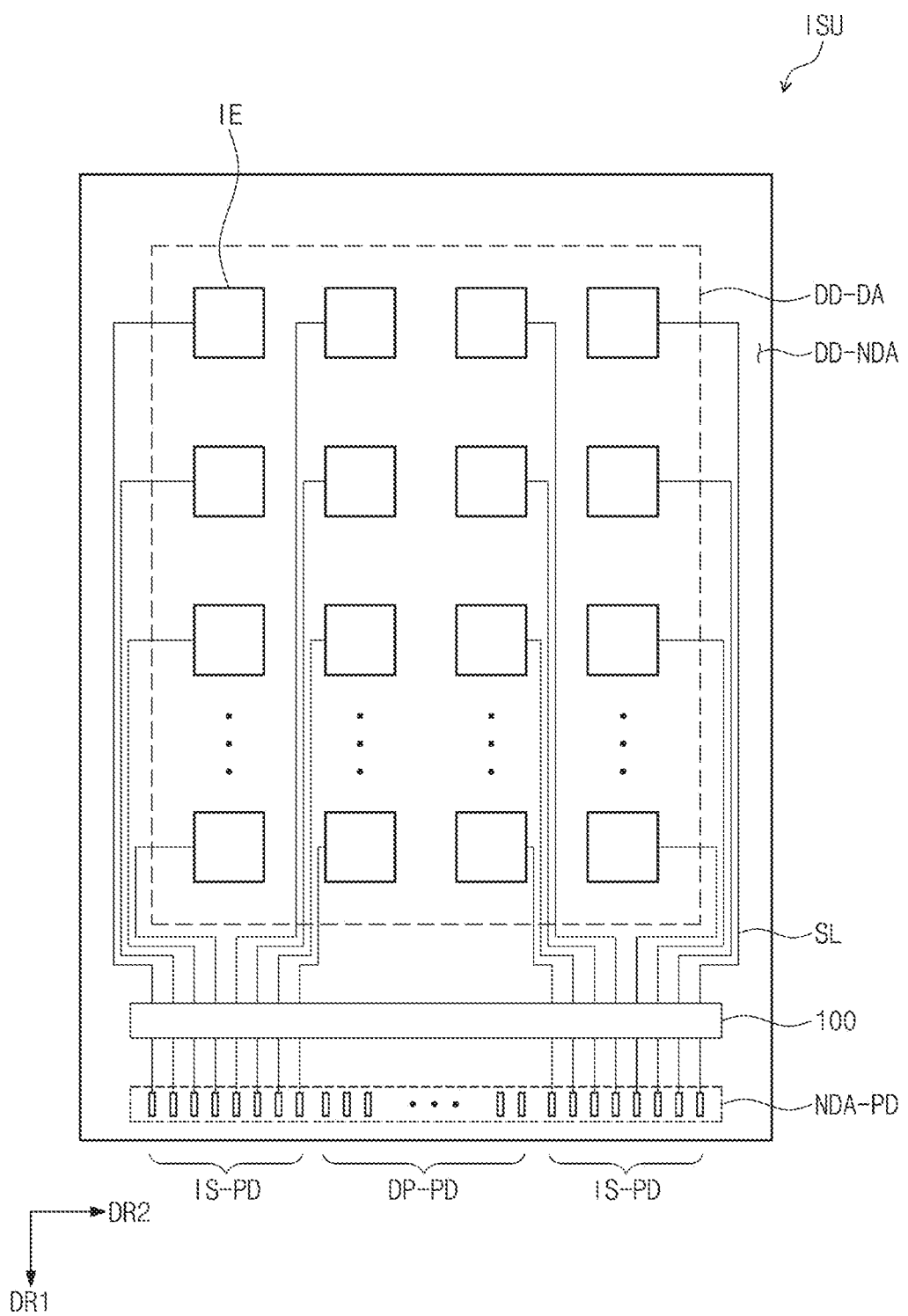
FIG. 4 is a plan view of an input sensing unit according to some exemplary embodiments.

FIG. 4 is a plan view of an input sensing unit according to some exemplary embodiments.

As shown in FIG. 4, an input sensing unit ISU may include a plurality of sensing electrodes IE (hereinafter, referred to as sensing electrodes) and a plurality of signal lines SL (hereinafter, referred to as signal lines). The sensing electrodes IE have unique coordinate information. For example, the sensing electrodes IE may be arranged in a matrix form and connected to the signal lines SL, respectively. The shape and arrangement of the sensing electrodes IE are not particularly limited. The sensing electrodes IE may be disposed in the display area DD-DA. Some of the signal lines SL may be disposed in the display area DD-DA, and some of the signal lines SL may be disposed in the non-display area DD-NDA. The input sensing unit ISU according to some exemplary embodiments may obtain coordinate information in a self-capping manner.

Although rectangular sensing electrodes IE are illustrated exemplarily, exemplary embodiments are not limited thereto. In some exemplary embodiments, the sensing electrodes IE may have a polygonal shape.

The sensing electrodes IE may include a conductive material. For example, the conductive material may include a metal or an alloy thereof. The metal may be at least one of Au, Ag, Al, Mo, Cr, Ti, Ni, Nd, Cu, and Pt.

In some exemplary embodiments, the sensing electrodes IE may be made of (or include) a transparent conductive material. The transparent conductive material may include at least one of silver nanowire (AgNW), indium tin oxide (ITO), indium zinc oxide (IZO), antimony zinc oxide (AZO), indium tin zinc oxide (ITZO), zinc oxide (ZnO), tin oxide ($SnO_2$), carbon nanotube, graphene, and the like. The sensing electrodes IE may be composed of a single layer or multiple layers.

The switching circuit 100 is disposed in the non-display area DD-NDA. The switching circuit 100 may electrically connect the input sensing pads IS-PD and the signal lines SL.

In general, the number of input sensing pads IS-PD is greater than or equal to the number of signal lines SL. In some exemplary embodiments, the input sensing unit ISU may include a switching circuit 100 to include a smaller number of input sensing pads IS-PD than the number of signal lines SL.

Figure 5:
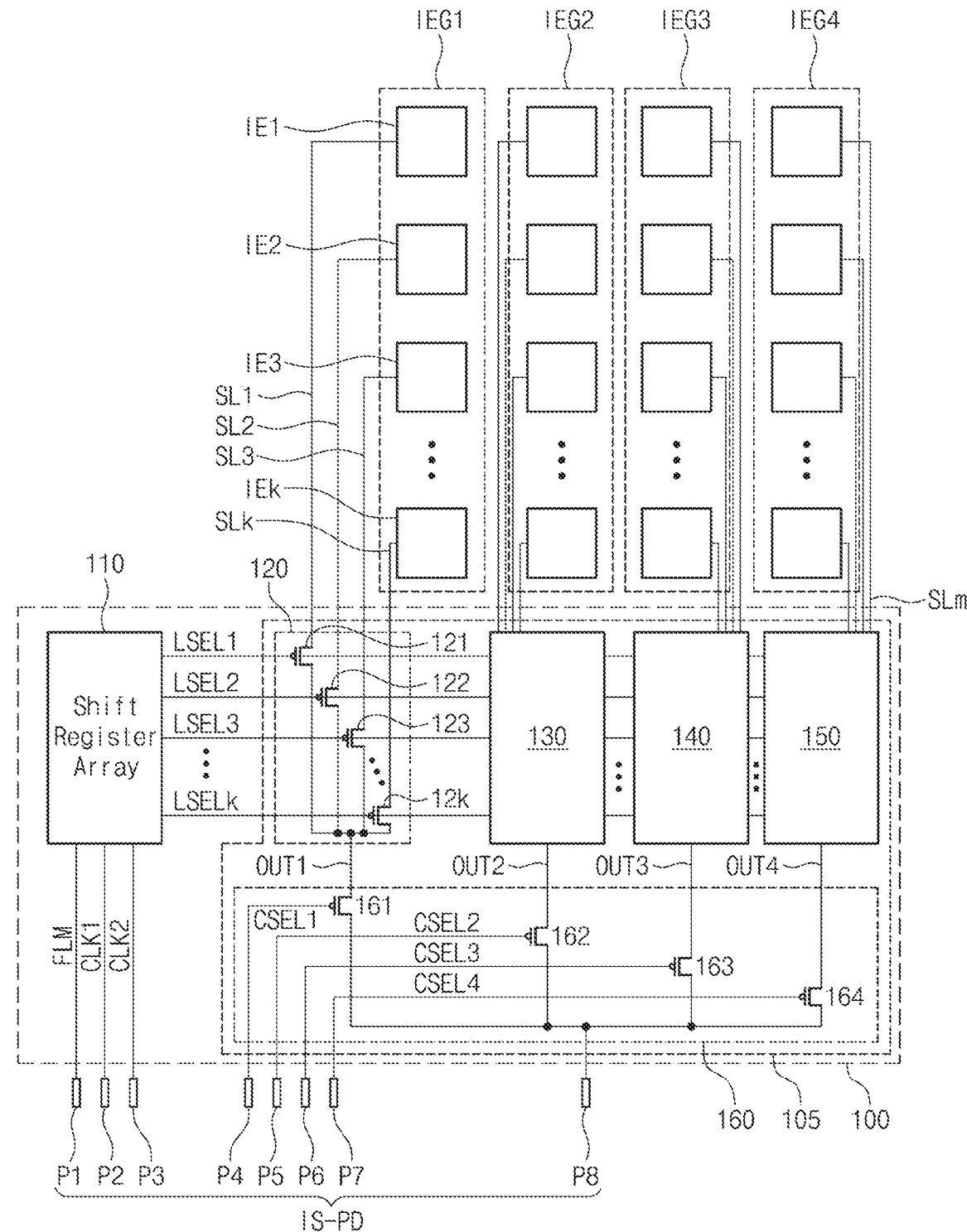
FIG. 5 is a circuit diagram of a switching circuit of an input sensing unit according to some exemplary embodiments.

FIG. 5 is a circuit diagram of a switching circuit of an input sensing unit according to some exemplary embodiments.

Referring to FIG. 5, the switching circuit 100 includes a shift register array 110 and a multiplexer circuit 105. In some exemplary embodiments, input sensing pads IS-PD include control signal pads P1 to P7 and a sensing pad P8.

The shift register array 110 receives a start signal FLM from the control signal pad P1 and at least one clock signal. In some exemplary embodiments, the shift register array 110 receives the first clock signal CLK1 from the control signal pad P2 and the second clock signal CLK2 from the control signal pad P3.

The shift register array 110 outputs a plurality of first selection signals LSEL1 to LSELk (where k is a positive integer greater than or equal to 2). In some exemplary embodiments, the shift register array 110 may sequentially activate the first selection signals LSEL1 to LSELk to a first level (e.g., a low level). The circuit configuration and operation of the shift register array 110 will be described later in more detail with reference to FIGS. 6 and 7.

The multiplexer circuit 105 selectively connects the plurality of signal lines SL1 SLm to the sensing pad P8 in response to the plurality of first selection signals LSEL1 to LSELk. In some exemplary embodiments, the number of sensing pads P8 is shown and described as one, but exemplary embodiments are not limited thereto.

The multiplexer circuit 105 includes first multiplexers 120 to 150 and a second multiplexer 160.

The sensing electrodes IE may be divided into a plurality of groups. In some exemplary embodiments, sensing electrodes arranged adjacently in a first direction DR1 among the sensing electrodes IE may be classified into one sensing electrode group. In some exemplary embodiments, since the sensing electrodes IE are arranged by four in the second direction DR2, they are divided into four sensing electrode groups IEG1 to IEG4, but exemplary embodiments are not limited thereto. For instance, the number of sensing electrodes IE and the number of sensing electrode groups arranged in the second direction DR2 may be variously changed. Furthermore, the number of sensing electrodes IE included in the sensing electrode group may be variously changed.

The first multiplexers 120 to 150 correspond to sensing electrode groups IEG1 to IEG4, respectively. Each of the first multiplexers 120 to 150 includes output nodes OUT1 to OUT4. The first multiplexers 120 to 150 electrically connect a signal line connected to one of the plurality of sensing electrodes IE in the corresponding sensing electrode group among the sensing electrode groups IEG1 to IEG4 to the output node in response to the first selection signals LSEL1 to LSELk.

The first multiplexer 120 electrically connects any one of the signal lines SL1 to SLk connected to the sensing electrodes IE1 to IEk in the sensing electrode group IEG1 to the output node OUT1 in response to the first selection signals LSEL1 to LSELk.

Since the circuit configuration and operation of the first multiplexers 130 to 150 are similar to those of the first multiplexer 120, redundant description is omitted.

Each of the first multiplexers 120 to 150 includes a plurality of switching transistors 121 to 12k. The switching transistor 121 includes a first electrode connected to the signal line SL1 connected to the corresponding sensing electrode IE1, a second electrode connected to the output node OUT1, and a gate electrode receiving the first selection signal LSEL1.

The switching transistor 122 includes a first electrode connected to the signal line SL2 connected to the corresponding sensing electrode IE2, a second electrode connected to the output node OUT1, and a gate electrode receiving the first selection signal LSEL2.

The switching transistor 123 includes a first electrode connected to the signal line SL3 connected to the corresponding sensing electrode IE3, a second electrode connected to the output node OUT1, and a gate electrode receiving the first selection signal LSEL3.

The switching transistor 12k includes a first electrode connected to the signal line SLk connected to the corresponding sensing electrode IEk, a second electrode connected to the output node OUT1, and a gate electrode receiving the first selection signal LSELk.

In some exemplary embodiments, the switching transistors 121 to 12k are composed of p-type metal-oxide-semiconductor (PMOS) transistors, but exemplary embodiments are not limited thereto. In some exemplary embodiments, the switching transistors 121 to 12k may be composed of n-type metal-oxide-semiconductor (NMOS) transistors. When the switching transistors 121 to 12k are composed of PMOS transistors, the activation section of the first selection signals LSEL1 to LSELk may be in a low level, and when the switching transistors 121 to 12k are composed of NMOS transistors, the activation section of the first selection signals LSEL1 to LSELk may be in a high level.

The second multiplexer 160 electrically connects any one of the output nodes OUT1 to OUT4 of the first multiplexers 120 to 150 to the sensing pad P8 in response to the second selection signals CSEL1 to CSEL4 received through the control signal pads P4 to P7.

The second multiplexer 160 includes a plurality of switching transistors 161 to 164 corresponding to the first multiplexers 120 to 150, respectively. In some exemplary embodiments, the switching transistors 161 to 164 are composed of PMOS transistors, but are not limited thereto. In some exemplary embodiments, the switching transistors 161 to 164 may be composed of NMOS transistors. When the switching transistors 161 to 164 are composed of PMOS transistors, the activation section of the second selection signals CSEL1 to CSEL4 may be in a low level, and when the switching transistors 161 to 164 are composed of NMOS transistors, the activation section of the second selection signals CSEL1 to CSELk may be in a high level.

The switching transistor 161 includes a first electrode connected to the output node OUT1 of the corresponding first multiplexer 120, a second electrode connected to the sensing pad P8, and a gate electrode receiving the second selection signal CSEL1.

The switching transistor 162 includes a first electrode connected to the output node OUT2 of the corresponding first multiplexer 130, a second electrode connected to the sensing pad P8, and a gate electrode receiving the second selection signal CSEL2.

The switching transistor 163 includes a first electrode connected to the output node OUT3 of the corresponding first multiplexer 140, a second electrode connected to the sensing pad P8, and a gate electrode receiving the second selection signal CSEL3.

The switching transistor 164 includes a first electrode connected to the output node OUT4 of the corresponding first multiplexer 150, a second electrode connected to the sensing pad P8, and a gate electrode receiving the second selection signal CSEL4.

Figure 6:
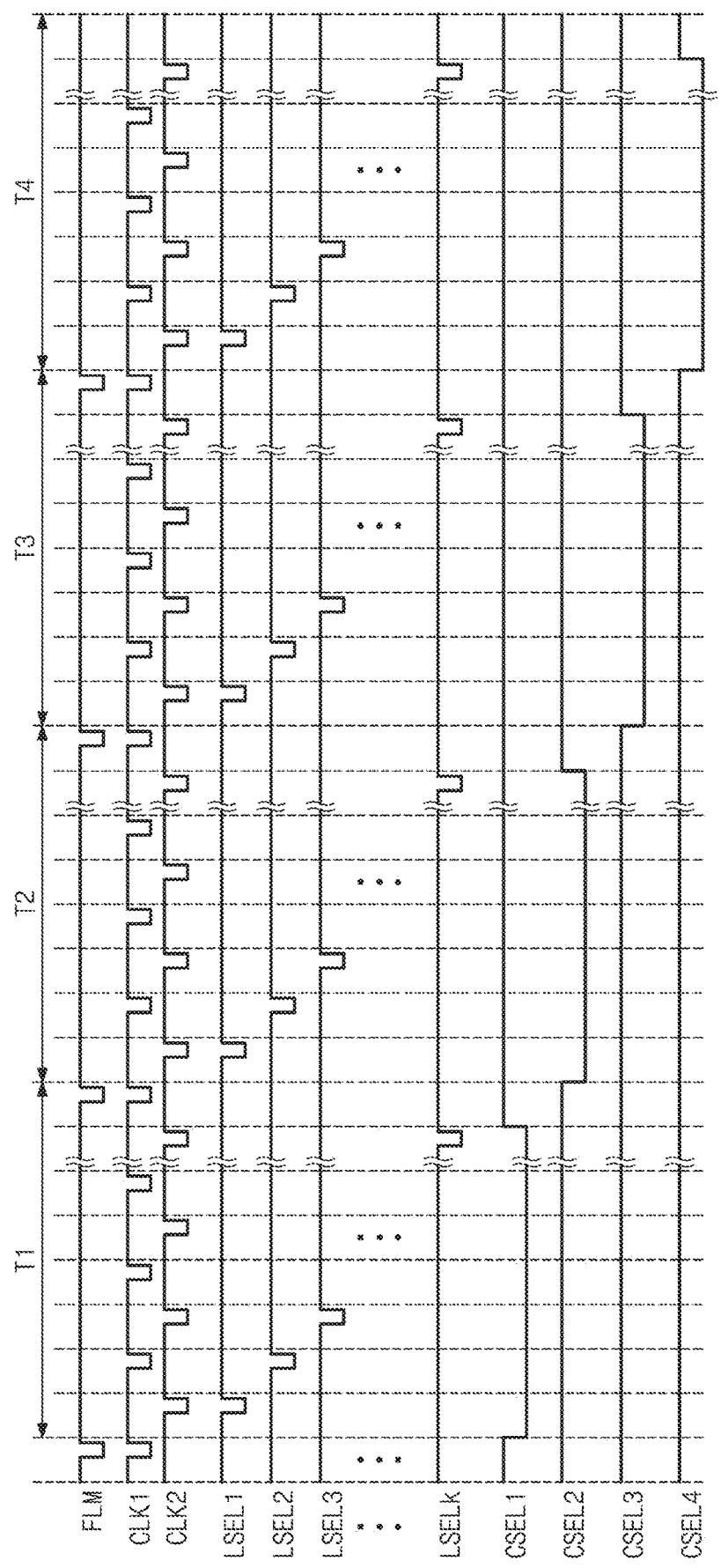
FIG. 6 is a timing diagram for explaining an operation of an input sensing unit according to some exemplary embodiments.

FIG. 6 is a timing diagram for explaining an operation of an input sensing unit according to some exemplary embodiments.

Referring to FIGS. 5 and 6, the start signal FLM is a signal indicating the driving start of each of the sensing electrode groups IEG1 to IEG4. The first section T1 is the operation section of the first sensing electrode group IEG1, the second section T2 is the operation section of the second sensing electrode group IEG2, the third section T3 is the operation section of the third sensing electrode group IEG3, and the fourth section T4 is the operation section of the fourth sensing electrode group IEG4.

The first clock signal CLK1 and the second clock signal CLK2 have the same period and are different in phase. The first selection signals LSEL1 to LSELk output from the shift register array 110 are signals for sequentially selecting sensing electrodes IE1 to IEk in the sensing electrode group. The second selection signals CSEL1 to CSEL4 are signals for sequentially selecting the first multiplexers 120 to 150.

For example, when the first selection signals LSEL1 to LSELk are sequentially activated to a low level in a state where the first multiplexer 120 is selected by the second selection signal CSEL1 activated to the low level, as the switching transistors 121 to 12k are sequentially turned on, the signal lines SL1 to SLk may be electrically connected to the sensing pad P8 sequentially. Therefore, the driving signal of the sensing pad P8 may be sequentially provided from the input sensing circuit IS-C (shown in FIGS. 3A and 3B) to the sensing electrodes IE1 to IEk. In addition, the sensing signals from the sensing electrodes IE1 to IEk may be provided to the input sensing circuit IS-C sequentially through the sensing pad P8.

According to some exemplary embodiments, as described above, in response to signals received from the seven control signal pads P1 to P7, the signal lines of 4×k sensing electrodes may be sequentially connected to one sensing pad P8. For instance, since the first selection signals LSEL1 to LSELk for controlling the first multiplexers 120 to 150 are output from the shift register array 110, three control signal pads P1 to P3 are used to control k switching transistors 121 to 12k. Thus, the display device DD may only use a significantly reduced number of input sensing pads IS-PD than the number of signal lines SL1 to SLm.

Figure 7:
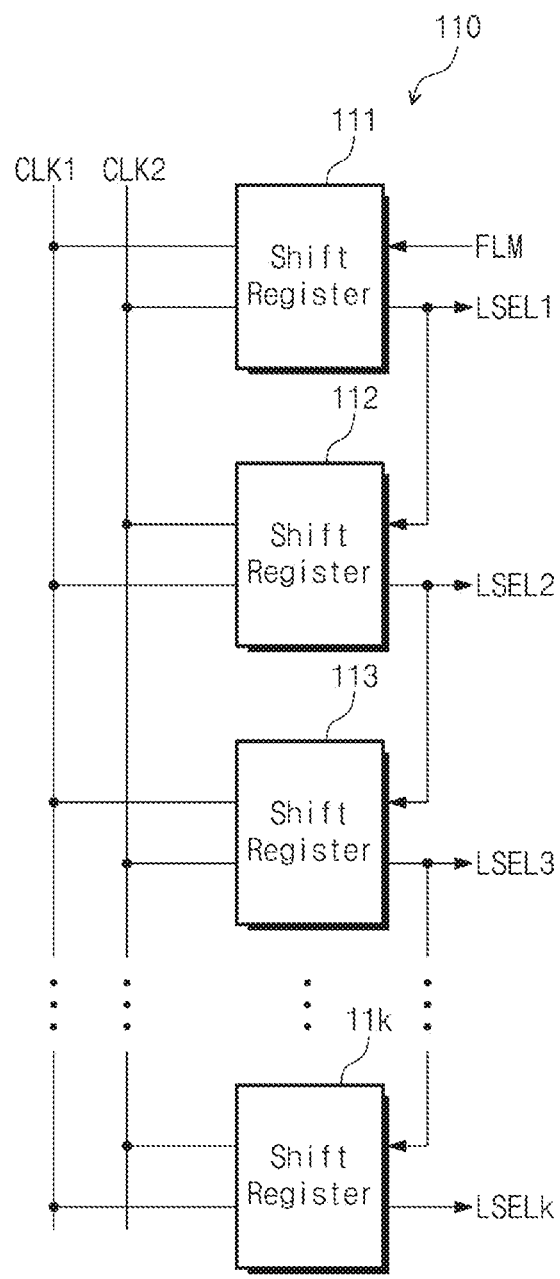
FIG. 7 is a block diagram of a shift register array of an input sensing unit according to some exemplary embodiments.

FIG. 7 is a block diagram of a shift register array of an input sensing unit according to some exemplary embodiments.

Referring to FIG. 7, the shift register array 110 includes a plurality of shift registers 111 to 11k. The shift registers 111 to 11k may have the same circuit configuration.

The shift registers 111 to 11k receive the first input signal, the first clock signal CLK1, and the second clock signal CLK2, and output the first selection signals LSEL1 to LSELk.

The first shift register 111 of the shift registers 111 to 11k receives the start signal FLM as the first input signal and outputs the first selection signal LSEL1.

An i-th shift register 11i among the shift registers 111 to 11k receives the first selection signal LSELi-1 from the (i−1)-th shift register 11i-1 as a first input signal, and outputs the first selection signal LSELi (where i is a positive integer greater than 1).

Figure 8:
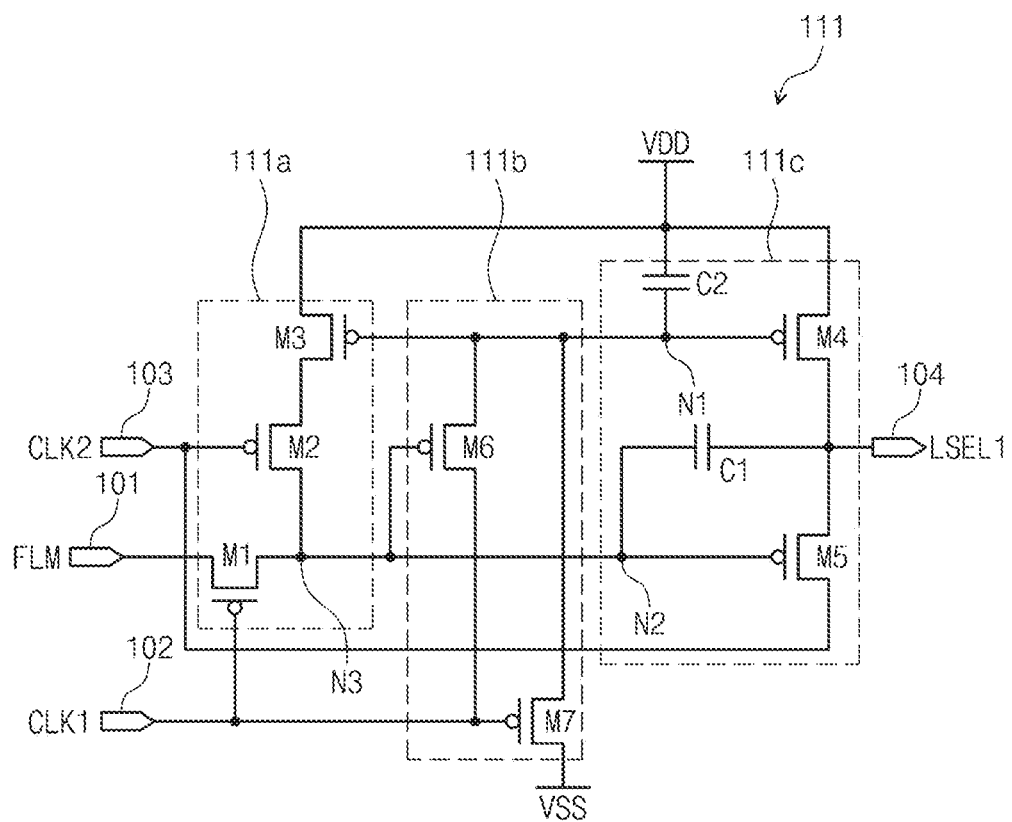
FIG. 8 is a circuit diagram of a shift register in a shift register array according to some exemplary embodiments.

FIG. 8 is a circuit diagram of a shift register in a shift register array according to some exemplary embodiments.

FIG. 8 shows only the circuit diagram of the shift register 111, but the other shift registers 112 to 11k shown in FIG. 7 may include the same circuit configuration as the shift register 111.

Referring to FIG. 8, the shift register 111 receives the start signal FLM through the first input terminal 101, receives the first clock signal CLK1 through the second input terminal 102, and receives the second clock signal CLK2 through the third input terminal 103. The shift register 111 outputs the first selection signal LSEL1 through the output terminal 104.

The start signal FLM is input to the first input terminal 101 of the shift register 111, but as shown in FIG. 7, the first input terminals 101 of the shift registers 112 to 11k may receive a first selection signal output from the previous shift register.

In addition, the odd-numbered shift registers 111, 113, . . . , and 11k-1 receive the first clock signal CLK1 through the second input terminal 102 and receive the second clock signal CLK2 through the third input terminal 103. The even-numbered shift registers 112, 114, . . . , and 11k receive the second clock signal CLK2 through the second input terminal 102 and receive the first clock signal CLK1 through the third input terminal 103.

The shift register 111 includes a first input circuit 111a, a second input circuit 111b, and an output circuit 111c.

The first input circuit 111a includes transistors M1 to M3 and controls the voltage levels of the first node N1 and the third node N3 in response to the start signal FLM, the first clock signal CLK1, and the second clock signal CLK2. The transistor M1 includes a first electrode connected to the first input terminal 101, a second electrode connected to the third node N3, and a gate electrode connected to the second input terminal 102. The transistor M2 includes a first electrode, a second electrode connected to the third node N3, and a gate electrode connected to the third input terminal 103. The transistor M3 includes a first electrode for receiving a power supply voltage VDD, a second electrode connected to the first electrode of the transistor M2, and a gate electrode connected to the first node N1.

The second input circuit 111b includes transistors M6 and M7, and controls the voltage level of the second node N2 in response to the voltage levels of the third node N3 and the first clock signal CLK1. The transistor M6 includes a first electrode connected to the first node N1, a second electrode connected to the second input terminal 102, and a gate electrode connected to the third node N3. The transistor M7 includes a first electrode connected to the first node N1, a second electrode for receiving the ground voltage VSS, and a gate electrode connected to the second input terminal 102.

The output circuit 111c includes transistors M4 and M5 and capacitors C1 and C2, and controls the voltage level of the first selection signal LSEL1 output to the output terminal 104 according to the voltage levels of the first node N1 and the second node N2. The transistor M4 includes a first electrode for receiving the power supply voltage VDD, a second electrode connected to the output terminal 104, and a gate electrode connected to the first node N1. The transistor M5 includes a first electrode connected to the third input terminal 103, a second electrode connected to the output terminal 104, and a gate electrode connected to the second node N2.

In some exemplary embodiments, the transistors M1 to M7 included in the shift register 111 may be composed of PMOS transistors. In some exemplary embodiments, the transistors M1 to M7 included in the shift register 111 may be composed of NMOS transistors.

The transistors M1 to M7 included in the shift register 111 may be formed through the same process as the pixels PX included in the display panel DP (shown in FIGS. 3A and 3B), for example, the LTPS process or the LTPO process. Further, by using the shift register 111 having a simple circuit configuration, the first selection signals LSEL1 to LSELk for controlling the switching transistors 121 to 12k in the first multiplexers 120 to 150 shown in FIG. 5 may be output. Thus, the number of input sensing pads IS-PD can be reduced as compared to directly receiving the first selection signals LSEL1 to LSELk through the input sensing pads IS-PD.

Figure 9:
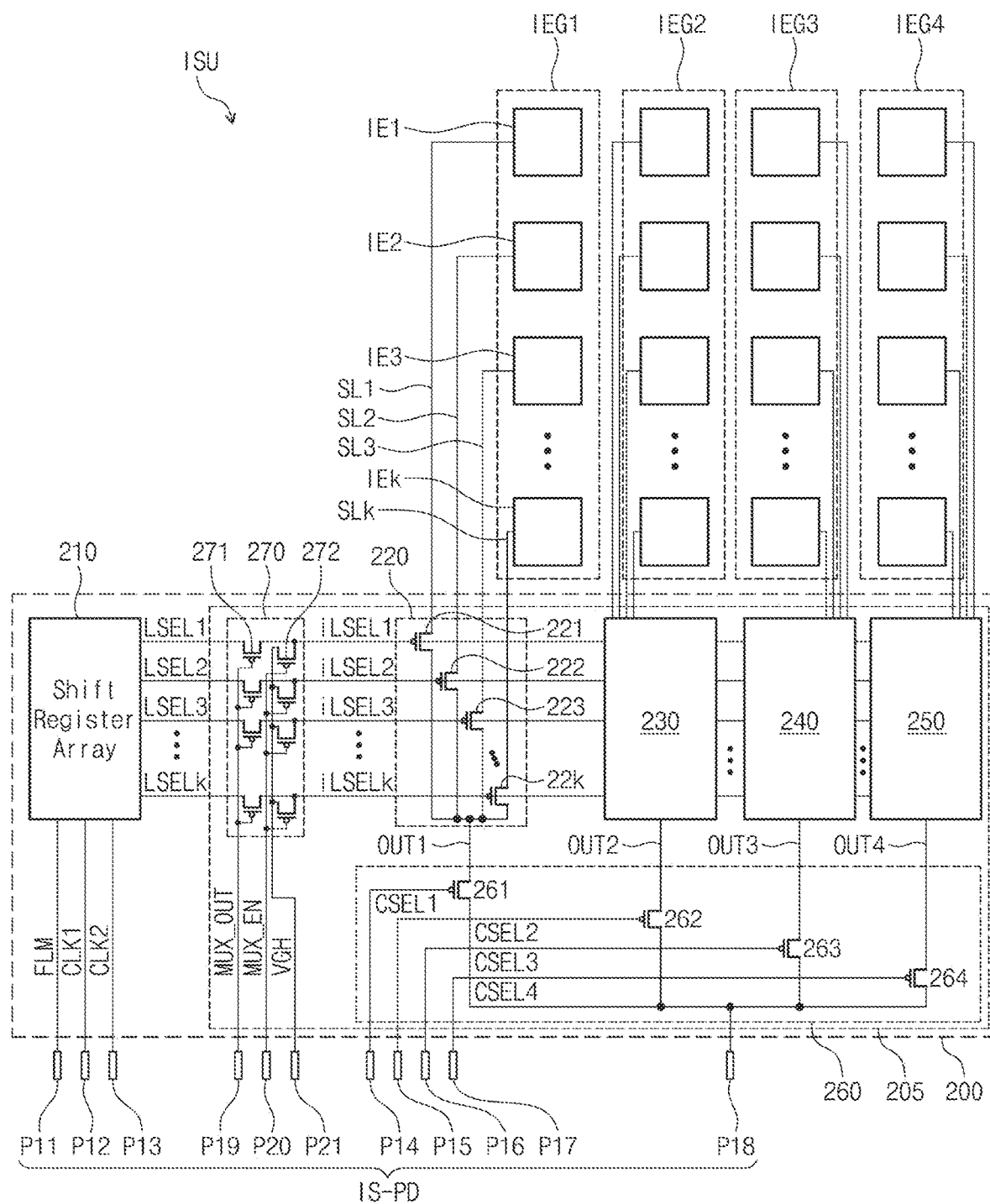
FIG. 9 is a circuit diagram of a switching circuit of an input sensing unit according to some exemplary embodiments.

FIG. 9 is a circuit diagram of a switching circuit of an input sensing unit according to some exemplary embodiments.

Referring to FIG. 9, an input sensing unit ISU includes sensing electrode groups IEG1 to IEG4, a switching circuit 200, and input sensing pads IS-PD. The input sensing pads IS-PD includes control signal pads P11 to P17 and P19 to P21 and a sensing pad P18. The switching circuit 200 shown in FIG. 9 further includes a masking circuit 270 in the switching circuit 100 shown in FIG. 5.

The masking circuit 270 includes output switching transistors 271 and output enable transistors 272. The output switching transistors 271 correspond to the first selection signals LSEL1 to LSELk, respectively. The output switching transistors 271 include a first electrode connected to the corresponding first selection signal among the first selection signals LSEL1 to LSELk, a second electrode, and a gate electrode connected to the control signal pad P19. The output enable transistors 272 include a first electrode connected to the control signal pad P21, a second electrode, and a gate electrode connected to the control signal pad P20. The second electrodes of the output switching transistors 271 and the second electrodes of the output enable transistors 272 are connected to each other and output internal selection signals iLSEL1 to iLSELk. The internal selection signals iLSEL1 to iLSELk are provided to the gate electrodes of the switching transistors 221 to 22k in the first multiplexers 220 to 250, respectively.

The control signal pad P19 receives the output control signal MUX_OUT, the control signal pad P21 receives the output enable signal MUX_EN, and the control signal pad P20 receives the first voltage VGH. The first voltage VGH has a voltage level for turning off the switching transistors 221 to 22k. For example, the first voltage VGH may be the power supply voltage VDD.

Figure 10:
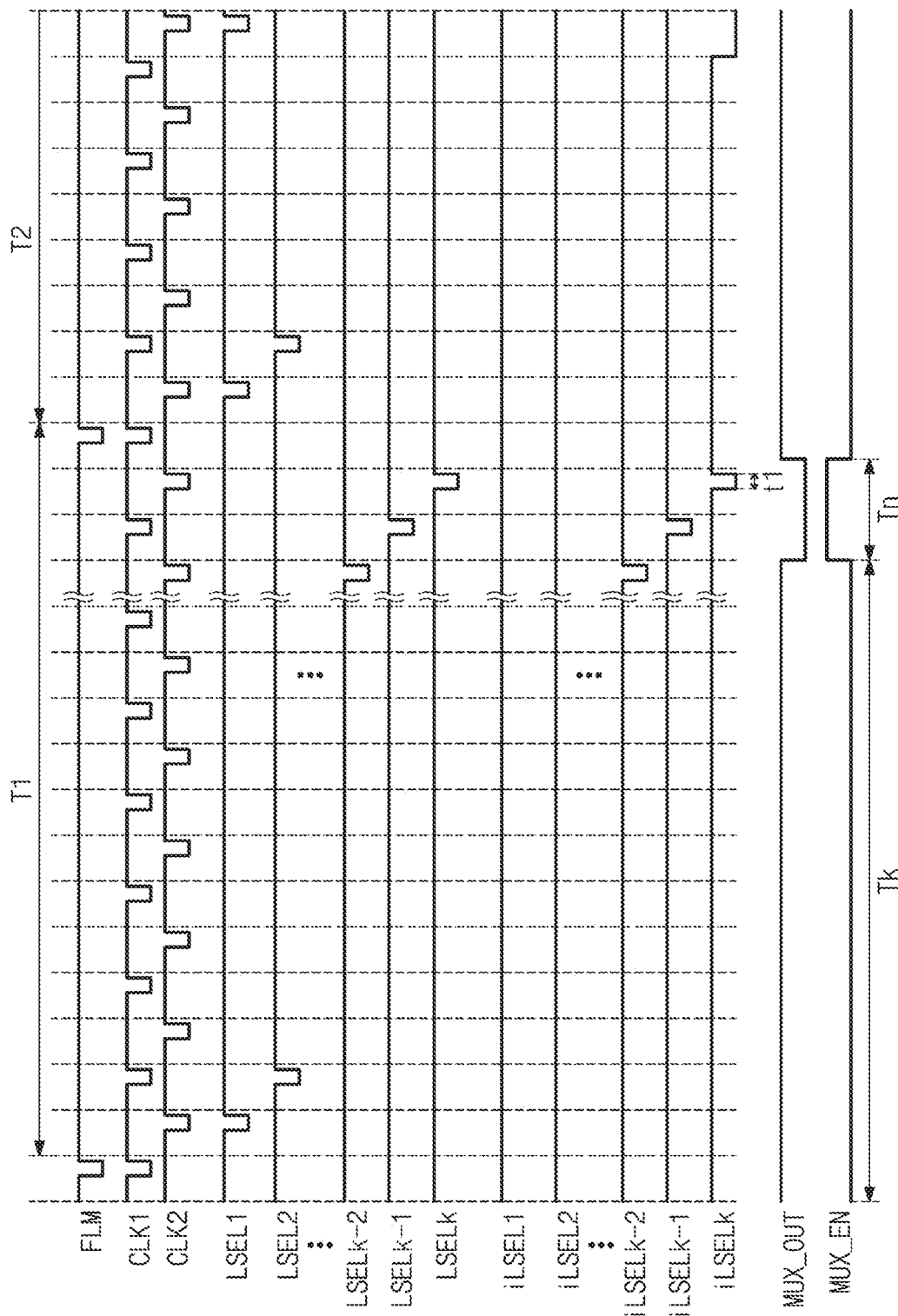
FIG. 10 is a timing diagram for explaining an operation of an input sensing unit according to some exemplary embodiments.

FIG. 10 is a timing diagram for explaining an operation of an input sensing unit according to some exemplary embodiments.

Referring to FIGS. 9 and 10, during the masking section Tk in which the output control signal MUX_OUT is in a high level and the output enable signal MUX_EN is in a low level, the output switching transistors 271 are turned off, and the output enable transistors 272 are turned on. Therefore, the internal selection signals iLSEL1 to iLSELk-3 are maintained in the inactive level, i.e., the high level, during the masking section Tm. During the normal section Tn in which the output control signal MUX_OUT is in a low level and the output enable signal MUX_EN is in a high level, the output switching transistors 271 are turned on, and the output enable transistors 272 are turned off. Therefore, during the normal section Tn, the internal selection signals iLSELk-2, iLSELk-1, and iLSELk have the same signal level as the first selection signals LSELk-2, LSELk-1, and LSELk.

According to the masking circuit 270 shown in FIG. 9, only certain sensing electrodes in the sensing electrode groups IEG1 to IEG4 may be controlled to operate. For example, as shown in FIG. 10, the internal selection signals iLSEL1 to ILSELk-3 are maintained in the inactive level, and when the internal selection signals iLSELk-2, iLSELk-1, and iLSELk have the same signal level as the first selection signals LSELk-2, LSELk-1, and LSELk, only the sensing electrodes IEk-2, IEk-1, and IEk in the sensing electrode groups IEG1 to IEG4 may operate. Therefore, the input sensing unit ISU may operate to detect only the touch input from the sensing electrodes of a specific (or determined) area.

According to some exemplary embodiments, in the first section T1, the length of each of the masking section Tk and the normal section Tn may be changed variously.

Figure 11:
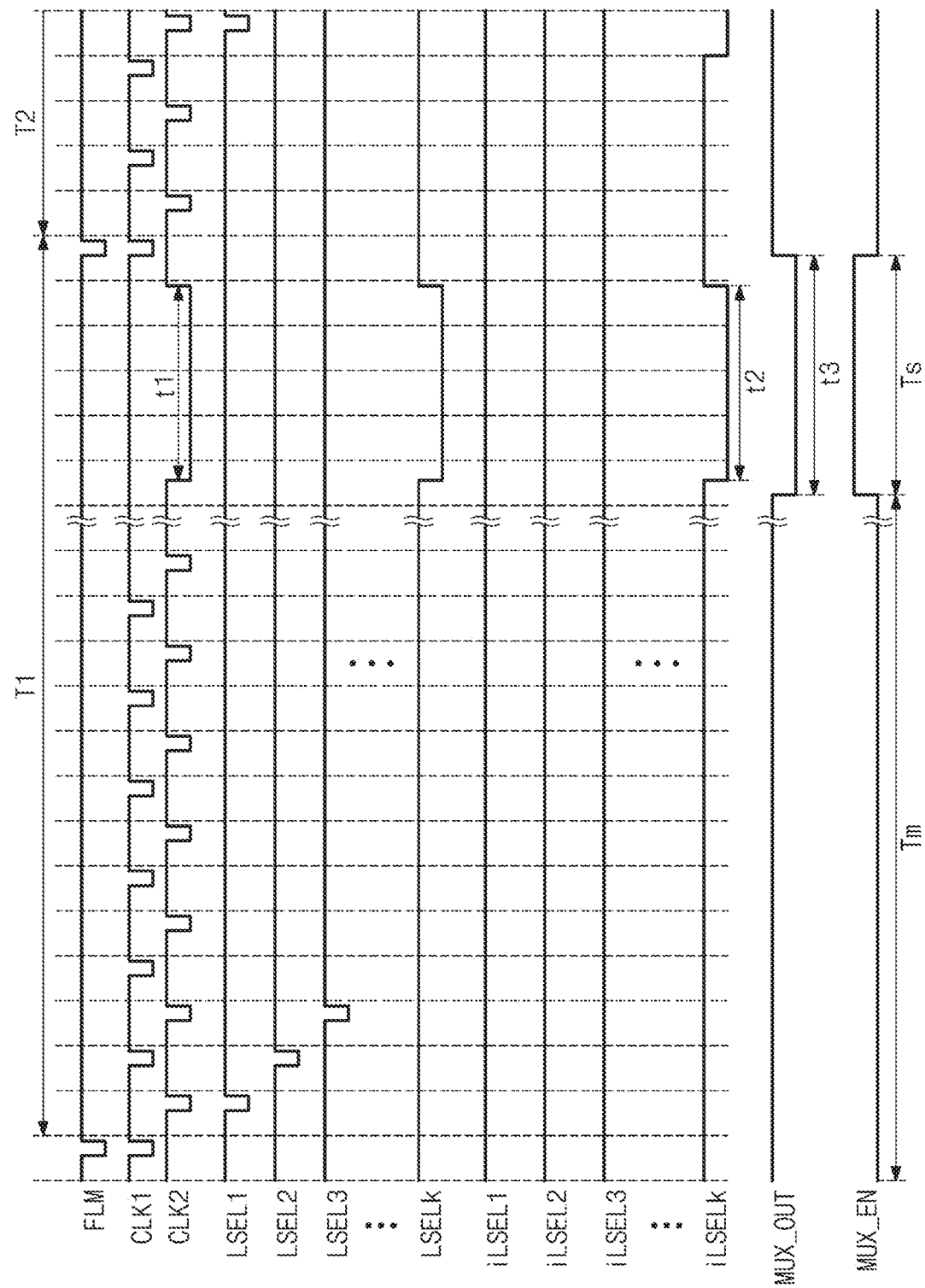
FIG. 11 is a timing diagram for explaining an operation of an input sensing unit according to some exemplary embodiments.

FIG. 11 is a timing diagram for explaining an operation of an input sensing unit according to some exemplary embodiments.

Referring to FIGS. 9 and 11, the input sensing unit ISU may operate in a masking mode Tk and a slow mode Ts. The frequencies of the first clock signal CLK1 and the second clock signal CLK2 in the slow mode Ts are different (e.g., lower) than the frequencies of the first clock signal CLK1 and the second clock signal CLK2 in the masking mode Tm.

In the masking mode Tm, the output control signal MUX_OUT is in the high level and the output enable signal MUX_EN is in the low level. In the slow mode Ts, the output control signal MUX_OUT is in the low level and the output enable signal MUX_EN is in the high level. In the example shown in FIG. 11, the internal selection signal iLSELk has the same signal level as the first selection signal LSELk during the slow mode Ts. In addition, the activation section t2 of the internal selection signal iLSELk is also substantially the same as the low level section t1 of the second clock signal CLK2. The time t3 at which the output control signal MUX_OUT is in the low level and the output enable signal MUX_EN is maintained in the high level in the slow mode Ts may be longer than or equal to the low level section t1 of the second clock signal CLK2.

As the activation section t2 of the internal selection signal iLSELk becomes longer in the slow mode Ts, the sensing time for the corresponding sensing electrode IEk may be sufficiently secured. Therefore, the touch sensitivity to a specific (or determined) area may be improved.

In some exemplary embodiments, as the frequencies of the first clock signal CLK1 and the second clock signal CLK2 become lower in the slow mode Ts, the length of the first section T1 may be longer than that of the general operation mode in which the slow mode Ts is not applied. In some exemplary embodiments, while maintaining the length of the first section T1, the frequencies of the first clock signal CLK1 and the second clock signal CLK2 may be decreased during the slow mode Ts, and simultaneously, the frequencies of the first clock signal CLK1 and the second clock signal CL2 may be increased during the masking mode Tm.

Figure 12:
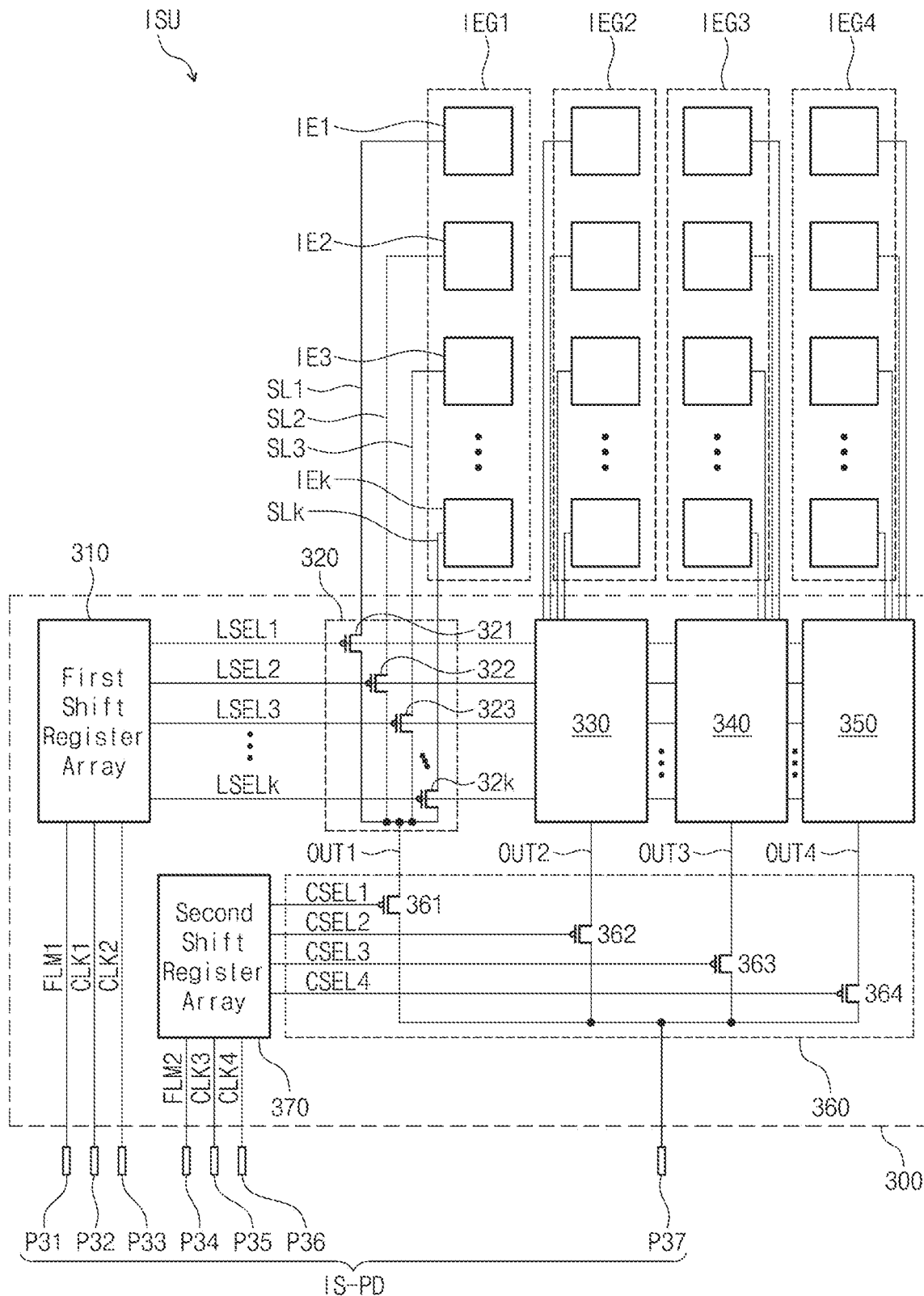
FIG. 12 is a circuit diagram of a switching circuit of an input sensing unit according to some exemplary embodiments.
Figure 13:
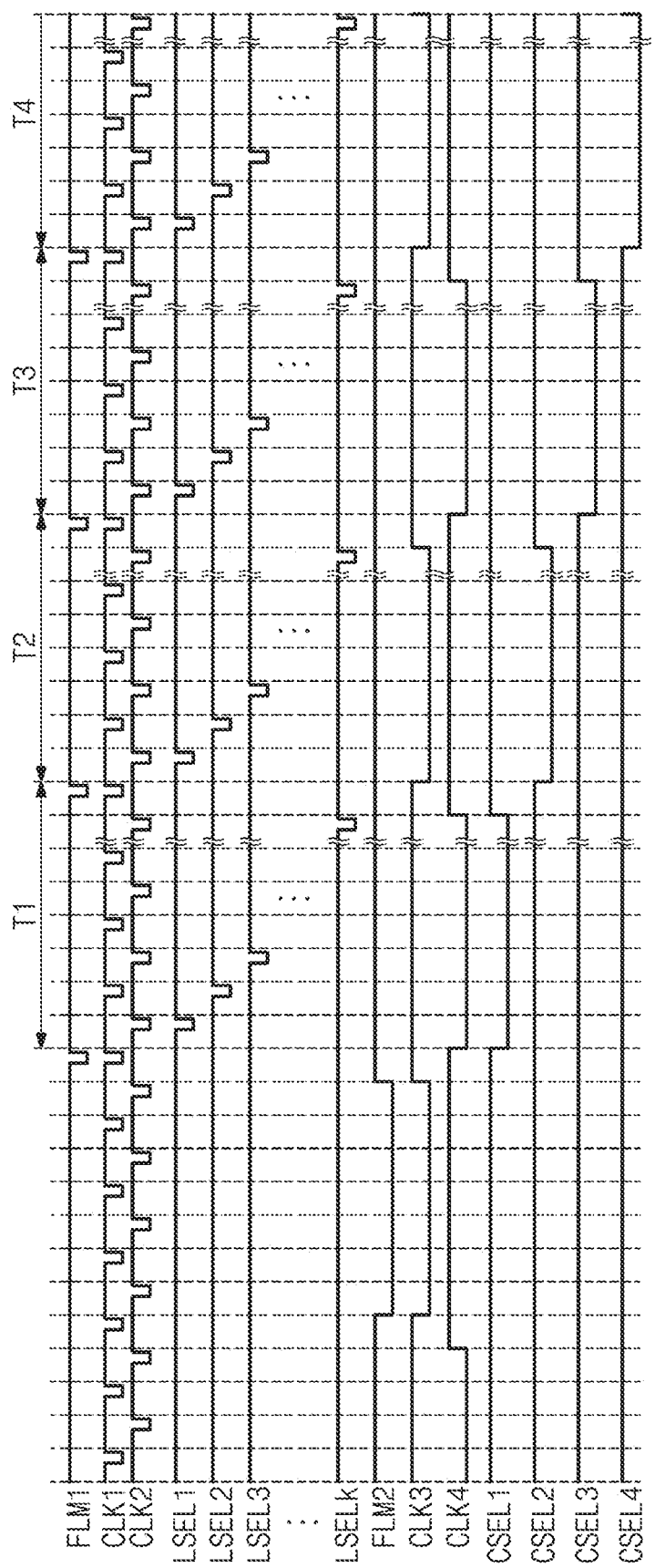
FIG. 13 is a timing diagram for explaining an operation of an input sensing unit according to some exemplary embodiments.

FIG. 12 is a circuit diagram of a switching circuit of an input sensing unit according to some exemplary embodiments. FIG. 13 is a timing diagram for explaining an operation of an input sensing unit according to some exemplary embodiments.

Referring to FIGS. 12 and 13, the switching circuit 300 of the input sensing unit ISU includes a first shift register array 310, first multiplexers 320 to 350, a second multiplexer 360, and a second shift register array 370. In other words, the switching circuit 300 shown in FIG. 12 further includes a second shift register array 370 as compared to the switching circuit 100 shown in FIG. 5.

The second shift register array 370 may be configured similar to the circuit configuration of the shift register array 110 shown in FIGS. 7 and 8.

The first shift register array 310 receives the first start signal FLM1 from the control signal pad P31, the first clock signal CLK1 from the control signal pad P32, and the second clock signal CLK2 from the control signal pad P33. The first shift register array 310 may sequentially activate the first selection signals LSEL1 to LSELk.

The second shift register array 370 receives the second start signal FLM2 from the control signal pad P34, the third clock signal (or referred to as "a sub-clock signal") CLK3 from the control signal pad P35, and the fourth clock signal (or referred to as "a sub-clock signal") CLK4 from the control signal pad P36. The second shift register array 370 may sequentially activate the second selection signals CSEL1 to CSEL4.

The second multiplexer 160 of the switching circuit 100 shown in FIG. 5 operates in response to the second selection signals CSEL1 to CSEL4 received through the control signal pads P4 to P6, but the second multiplexer 360 of the switching circuit 300 shown in FIG. 12 receives the second selection signals CSEL1 to CSEL4 from the second shift register array 370.

As the number of sensing electrode groups IEG1 to IEG4 increases, the number of switching transistors 361 to 364 in the second multiplexer 360 also increases. Accordingly, the switching circuit 300 may further include a second shift register array 370 to reduce the number of input sensing pads IS-PD.

Figure 14A:
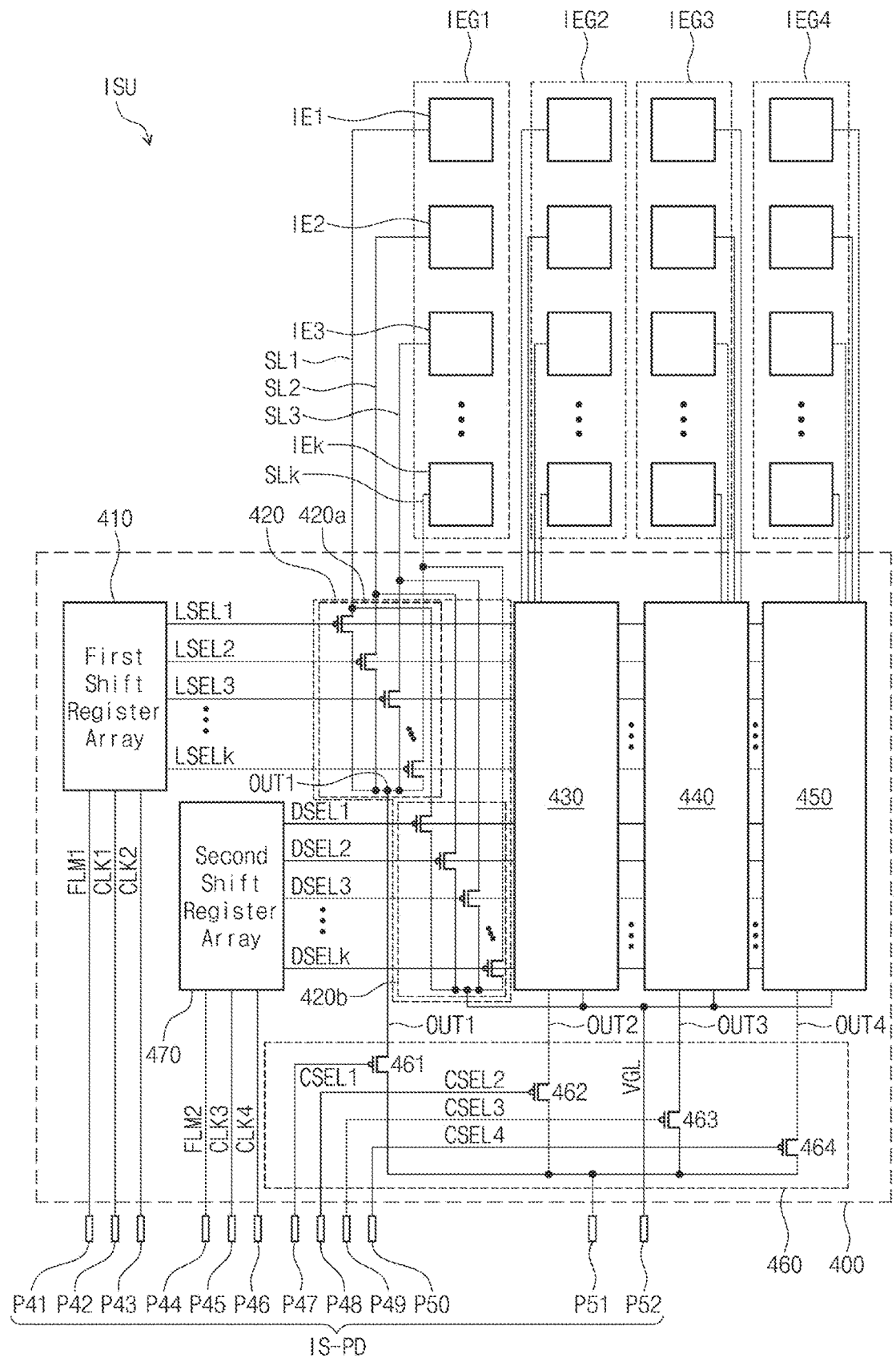
FIG. 14A is a circuit diagram of a switching circuit of an input sensing unit according to some exemplary embodiments.
Figure 14B:
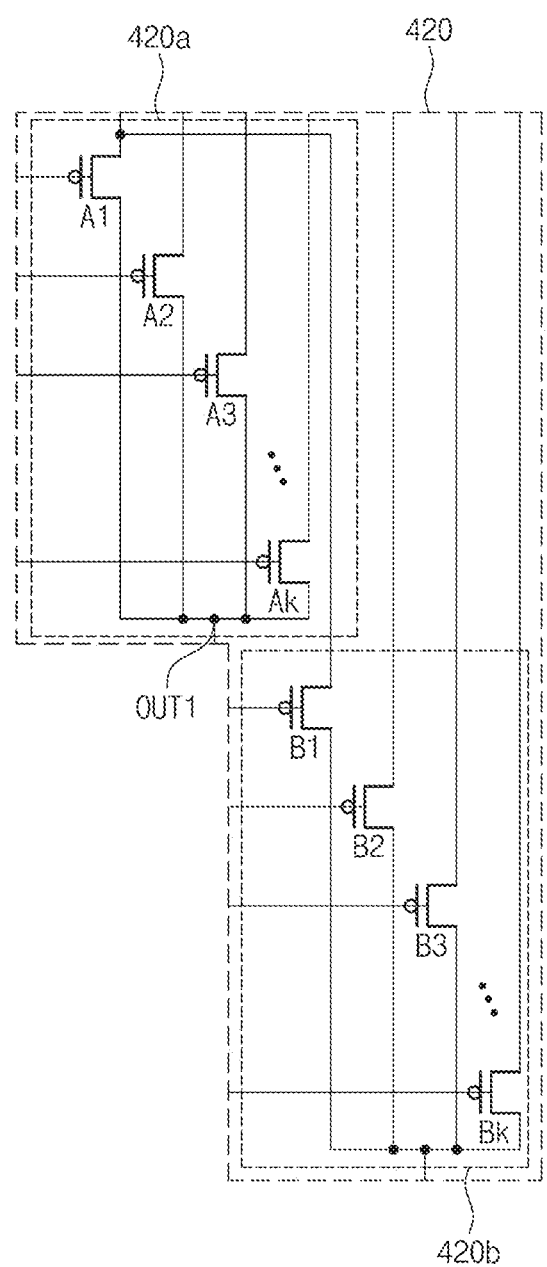
FIG. 14B is an enlarged view of a first multiplexer shown in FIG. 14A according to some exemplary embodiments.

FIG. 14A is a circuit diagram of a switching circuit of an input sensing unit according to some exemplary embodiments. FIG. 14B is an enlarged view of the first multiplexer shown in FIG. 14A according to some exemplary embodiments.

Referring to FIGS. 14A and 14B, the switching circuit 400 of the input sensing unit ISU includes a first shift register array 410, first multiplexers 420 to 450, a second multiplexer 460, and a second shift register array 470. The switching circuit 400 shown in FIG. 14A further includes a second shift register array 470 as compared to the switching circuit 100 shown in FIG. 5.

The second shift register array 470 may be configured similar to the circuit configuration of the first shift register array 110 shown in FIGS. 7 and 8.

The first shift register array 410 receives the first start signal FLM1 from the control signal pad P41, the first clock signal CLK1 from the control signal pad P42, and the second clock signal CLK2 from the control signal pad P43. The first shift register array 410 may sequentially activate the first selection signals LSEL1 to LSELk.

The second shift register array 470 receives the second start signal FLM2 from the control signal pad P44, the third clock signal CLK3 from the control signal pad P45, and the fourth clock signal CLK4 from the control signal pad P46. The second shift register array 470 may sequentially activate the discharge selection signals DSEL1 to DSELk.

The first multiplexers 420 to 450 correspond to sensing electrode groups IEG1 to IEG4, respectively. The first multiplexer 420 includes a main multiplexer 420a and a discharge multiplexer 420b.

The main multiplexer 420a electrically connects any one of the signal lines SL1 to SLk connected to the sensing electrodes IE1 to IEk in the sensing electrode group IEG1 to the output node OUT1 in response to the first selection signals LSEL1 to LSELk from the first shift register array 410. The main multiplexer 420a includes a plurality of switching transistors A1 to Ak.

The discharge multiplexer 420b electrically connects any one of the signal lines SL1 to SLk connected to the sensing electrodes IE1 to IEk in the sensing electrode group IEG1 to the control signal pad P52 in response to the discharge selection signals DSEL1 to DSELk from the second shift register array 470. The discharge multiplexer 420b includes a plurality of switching transistors B1 to Bk.

The control signal pad P52 may receive the second voltage VGL.

Since the circuit configuration and operation of the first multiplexers 430 to 450 are similar to those of the first multiplexer 420, redundant description is omitted.

Figure 15:
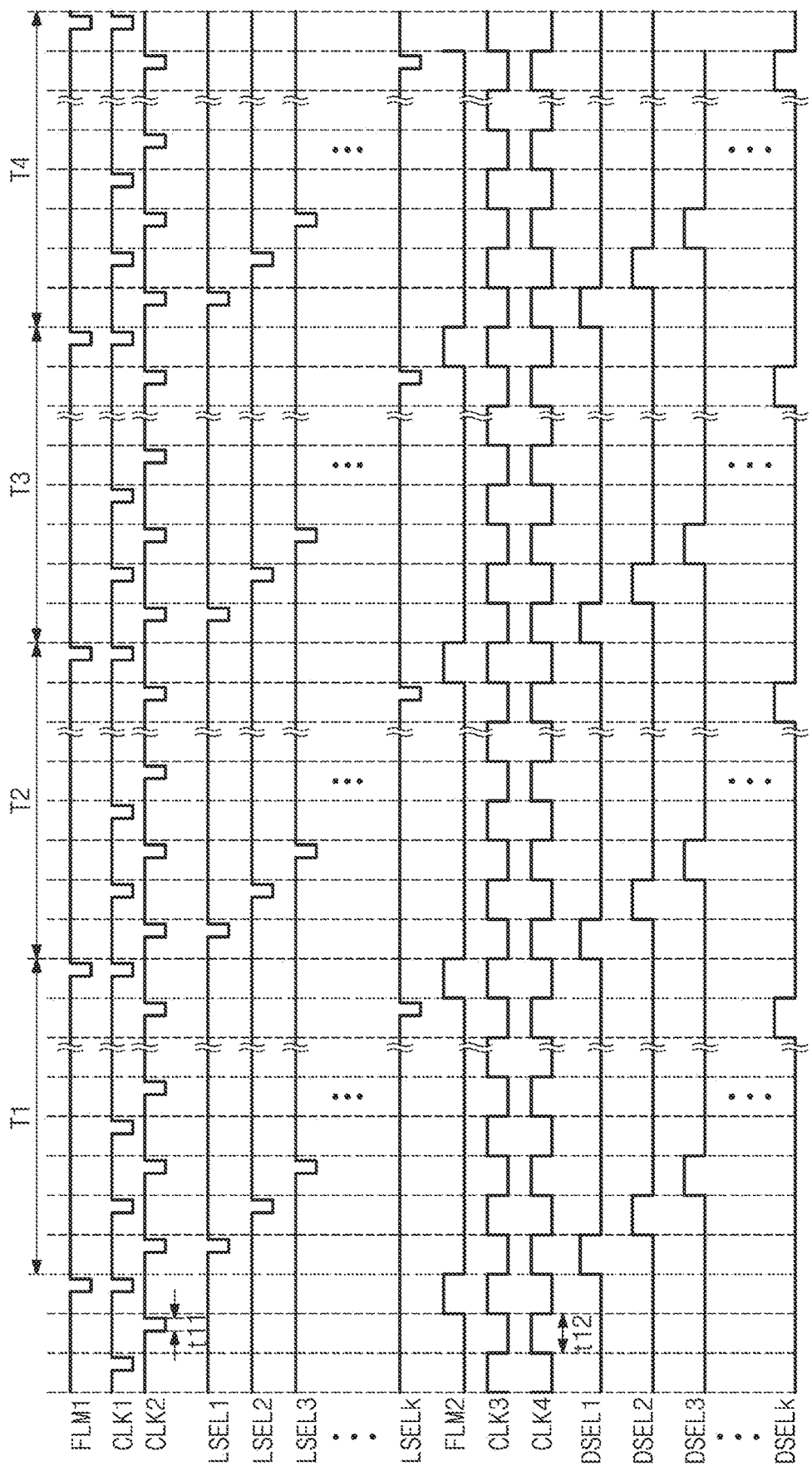
FIG. 15 is a timing diagram for explaining an operation of an input sensing unit according to some exemplary embodiments.

FIG. 15 is a timing diagram for explaining an operation of an input sensing unit according to some exemplary embodiments.

Referring to FIGS. 14A, 14B, and 15, the frequencies of the first to fourth clock signals CLK1 to CLK4 are the same. The pulse widths t11 of the activation section (e.g., low level) of the first clock signal CLK1 and the second clock signal CLK2 are substantially equal to each other, and the pulse widths t12 of the third clock signal CLK3 and the fourth clock signal CLK4 are substantially equal to each other. The pulse width t12 of the activation section of the third clock signal CLK3 and the fourth clock signal CLK4 is longer than the pulse width t11 of the first clock signal CLK1 and the second clock signal CLK2.

The switching transistors B1 to Bk in the discharge multiplexer 420b are turned on while the discharge selection signals DSEL1 to DSELk are in a low level and electrically connect the signal lines SL1 to SLk to the control signal pad P52. The signal lines SL1 to SLk are maintained at the second voltage VGL while the discharge selection signals DSEL1 to DSELk are in the low level, so that the influence of the noise may be minimized or at least reduced.

While the discharge selection signals DSEL1 to DSELk are in the high level, the switching transistors B1 to Bk in the discharge multiplexer 420b are turned off. While the discharge selection signals DSEL1 to DSELk are in the high level, the first selection signals LSEL1 to LSELk are activated. Accordingly, when the signal lines SL1 to SLk are connected to the sensing pad P51, the switching transistors B1 to Bk in the discharge multiplexer 420b are turned off so that the sensing signal from the signal lines SL1 to SLk may be normally transmitted to the sensing pad P51.

Figure 16A:
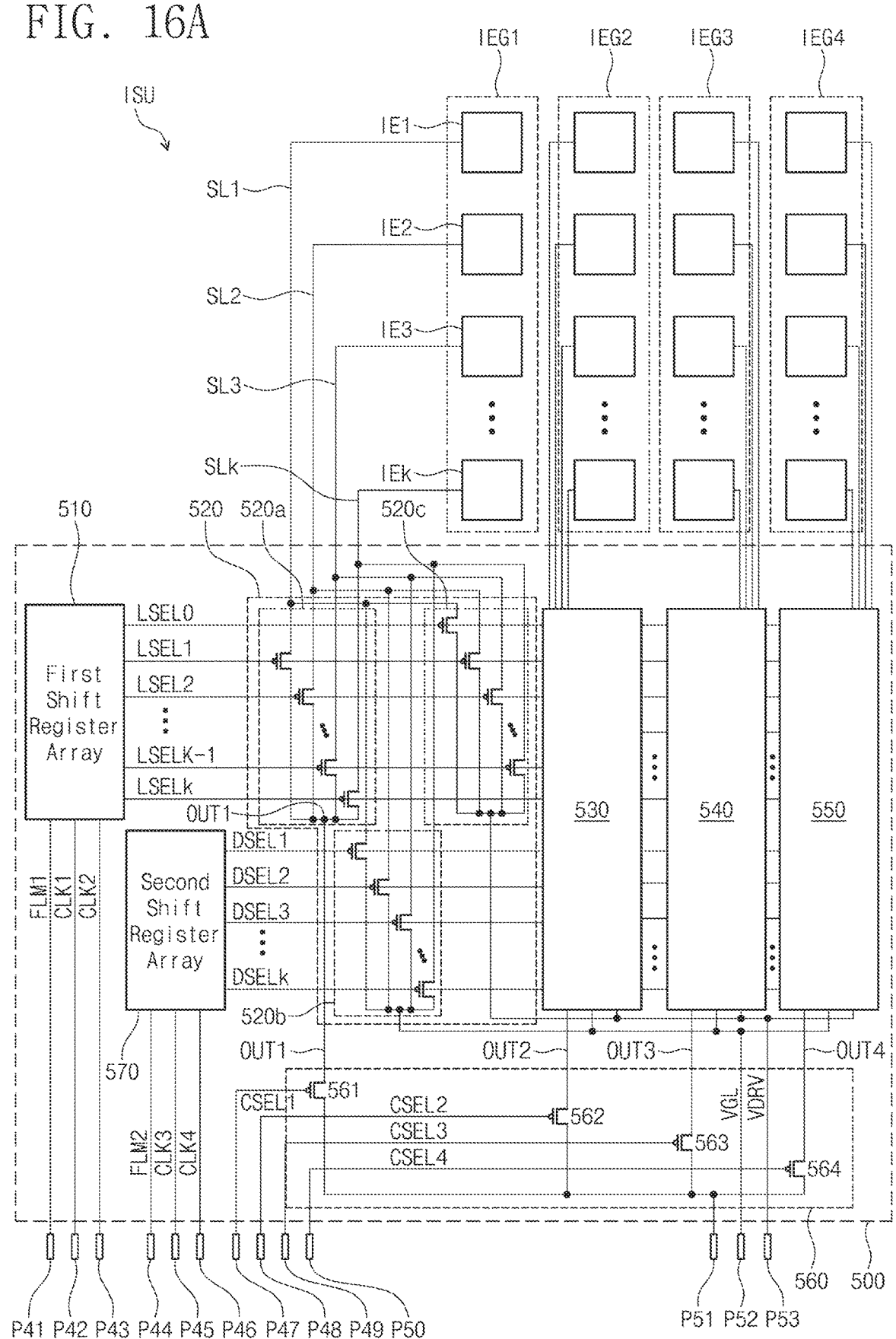
FIG. 16A is a circuit diagram of a switching circuit of an input sensing unit according to some exemplary embodiments.
Figure 16B:
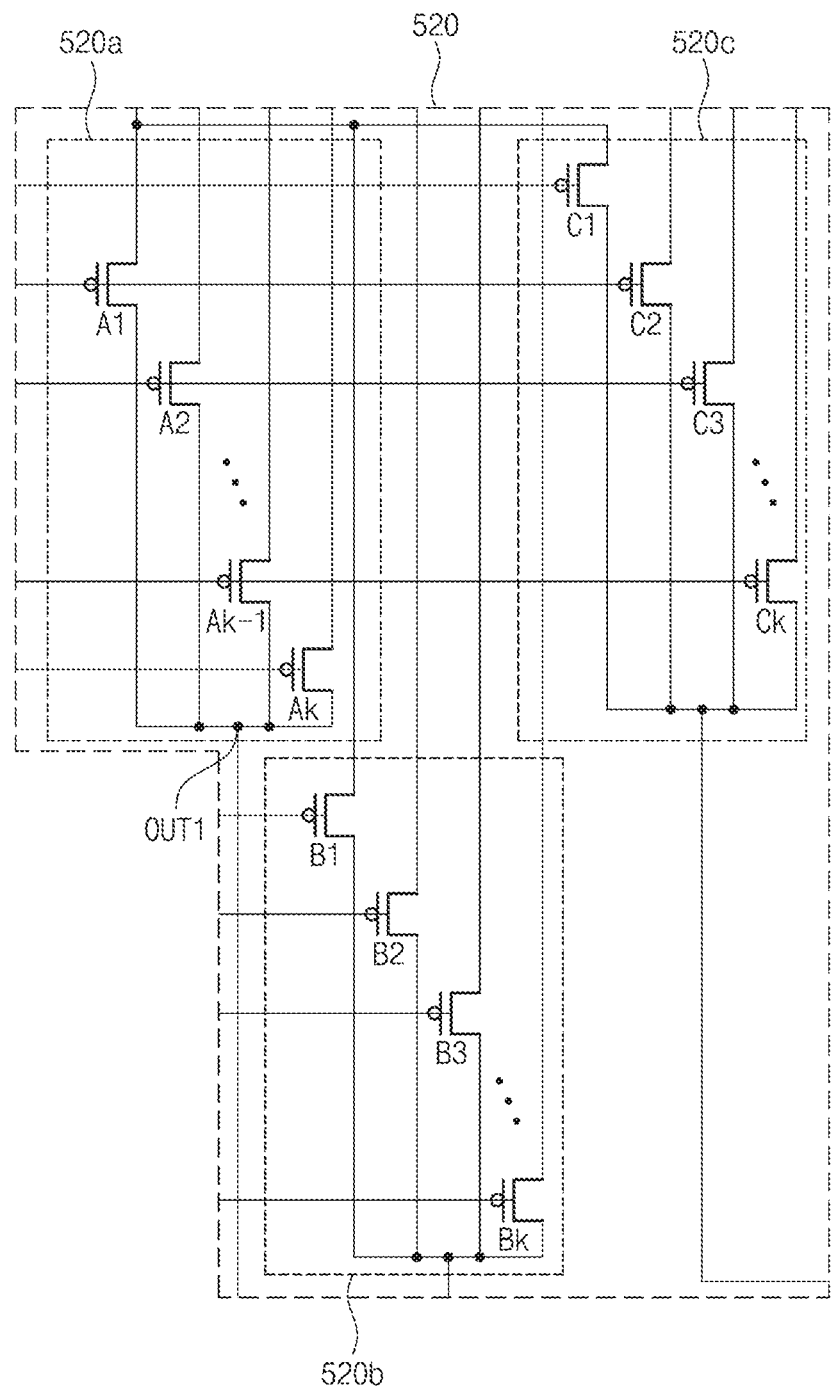
FIG. 16B is an enlarged view of a first multiplexer shown in FIG. 16A according to some exemplary embodiments.

FIG. 16A is a circuit diagram of a switching circuit of an input sensing unit according to some exemplary embodiments. FIG. 16B is an enlarged view of the first multiplexer shown in FIG. 16A according to some exemplary embodiments.

Referring to FIGS. 16A and 16B, the switching circuit 500 of the input sensing unit ISU includes a first shift register array 510, first multiplexers 520 to 550, a second multiplexer 560, and a second shift register array 570. The switching circuit 500 shown in FIG. 16 is similar to the switching circuit 400 shown in FIG. 14A, but further includes a pre-charge multiplexer 520c inside the first multiplexers 520 to 550.

The second shift register array 570 may be configured similar to the circuit configuration of the first shift register array 110 shown in FIGS. 7 and 8.

The first shift register array 510 receives the first start signal FLM1 from the control signal pad P41, the first clock signal CLK1 from the control signal pad P42, and the second clock signal CLK2 from the control signal pad P43. The first shift register array 510 outputs the first selection signals LSEL0 to LSELk, and the first selection signals LSEL0 to LSELk may be sequentially activated.

The second shift register array 570 receives the second start signal FLM2 from the control signal pad P44, the third clock signal CLK3 from the control signal pad P45, and the fourth clock signal CLK4 from the control signal pad P46. The second shift register array 470 may sequentially activate the discharge selection signals DSEL1 to DSELk.

The first multiplexers 520 to 550 correspond to sensing electrode groups IEG1 to IEG4, respectively. The first multiplexer 520 includes a main multiplexer 520a, a discharge multiplexer 420b, and a pre-charge multiplexer 520c.

The main multiplexer 520a electrically connects any one of the signal lines SL1 to SLk connected to the sensing electrodes IE1 to IEk in the sensing electrode group IEG1 to the output node OUT1 in response to the first selection signals LSEL1 to LSELk from the first shift register array 510. The main multiplexer 520a includes a plurality of switching transistors A1 to Ak.

The discharge multiplexer 520b electrically connects any one of the signal lines SL1 to SLk connected to the sensing electrodes IE1 to IEk in the sensing electrode group IEG1 to the control signal pad P52 in response to the discharge selection signals DSEL1 to DSELk from the second shift register array 570. The discharge multiplexer 520b includes a plurality of switching transistors B1 to Bk.

The pre-charge multiplexer 520c electrically connects any one of the signal lines SL1 to SLk connected to the sensing electrodes IE1 to IEk in the sensing electrode group IEG1 to the control signal pad P53 in response to the first selection signals LSEL0 to LSELk-1 from the first shift register array 510. The pre-charge multiplexer 520c includes a plurality of switching transistors C1 to Ck.

The control signal pad P52 may receive the second voltage VGL and the control signal pad P53 may receive the third voltage VDRV. The second voltage VGL may be the ground voltage VSS. The third voltage VDRV may be in (or at) a higher voltage level than the ground voltage VSS or the second voltage VGL.

Since the circuit configuration and operation of the first multiplexers 530 to 550 are similar to those of the first multiplexer 520, redundant description is omitted.

Figure 17:
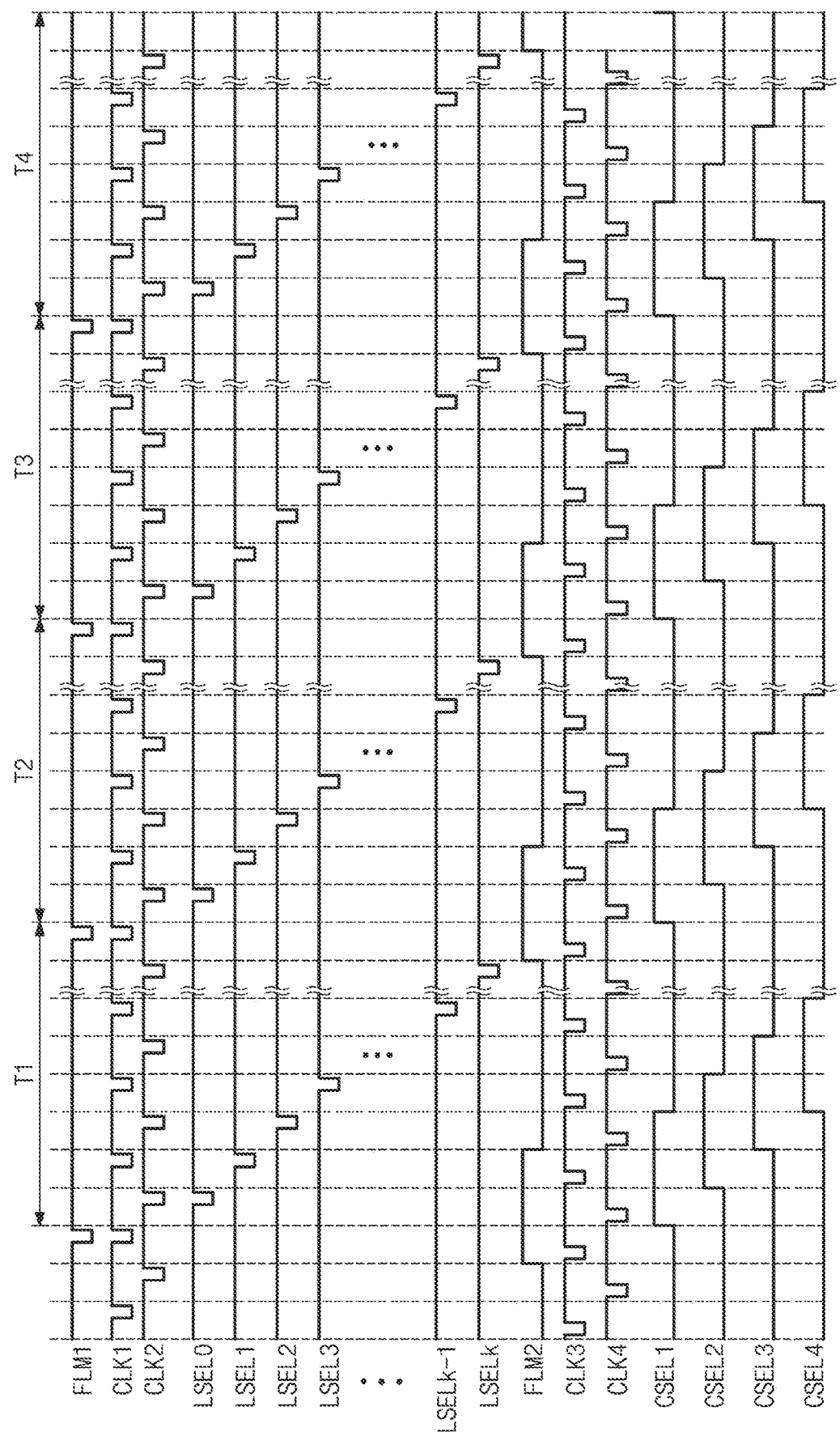
FIG. 17 is a timing diagram for explaining an operation of an input sensing unit according to some exemplary embodiments.

FIG. 17 is a timing diagram for explaining an operation of an input sensing unit according to some exemplary embodiments.

Referring to FIGS. 16A, 16B, and 17, the frequency and the pulse width of the first to fourth clock signals CLK1 to CLK4 are substantially the same.

When the first selection signal LSEL0 transits to the low level, the switching to transistor C1 in the pre-charge multiplexer 520c is turned on so that the signal line SL1 is connected to the control signal pad P53. Therefore, the signal line SL1 is pre-charged to the third voltage VDRV.

When the first selection signal LSEL1 transits to the low level, the switching transistor C2 in the pre-charge multiplexer 520c is turned on so that the signal line SL4 is connected to the control signal pad P53. Therefore, the signal line SL2 is pre-charged to the third voltage VDRV. Furthermore, when the first selection signal LSEL1 transits to the low level, the switching transistor A1 in the main multiplexer 520a is turned on so that the signal line SL3 is connected to the sensing pad P51 through the switching transistor 561 in the second multiplexer 560. As such, when the i-th first selection signal LSELi transits to the low level, the (i+1)-th switching transistor Ci+1 in the pre-charge multiplexer 520c and the switching transistor Ai in the main multiplexer 520a are simultaneously turned on (where i is a positive integer).

The switching transistors B1 to Bk in the discharge multiplexer 520b are turned on while the discharge selection signals DSEL1 to DSELk are in a low level and electrically connect the signal lines SL1 to SLk to the control signal pad P52. The signal lines SL1 to SLk are maintained at the second voltage VGL while the discharge selection signals DSEL1 to DSELk are in the low level, so that the influence of the noise may be minimized or at least reduced.

While the discharge selection signals DSEL1 to DSELk are in the high level, the switching transistors B1 to Bk in the discharge multiplexer 420b are turned off. While each of the discharge selection signals DSEL1 to DSELk is in a high level, the corresponding first selection signals LSEL0 to LSELk are activated.

The i-th signal line SLi is connected to the control signal pad P53 by the (i−1)-th first selection signal LSELi-1 and connected to the sensing pad P51 by the i-th first selection signal LSELi. Accordingly, when the i-th signal line SLi is connected to the control signal pad P53 or the sensing pad P51, the discharge selection signals DSEL1 to DSELk are maintained in a high level so that the switching transistors B1 to Bk in the discharge multiplexer 520b are turned off. As such, the activation section of the i-th discharge selection signal DSELi among the discharge selection signals DSEL1 to DSELk does not overlap the activation section of the (i−1)-th first selection signal LSELi-1 and the activation section of the i-th first selection signal LSELi.

Although it is shown and described that the i-th signal line SLi is connected to the control signal pad P53 by the (i−1)-th first selection signal LSELi-1 and connected to the sensing pad P51 by the i-th first selection signal LSELi, exemplary embodiments are not limited thereto. In some exemplary embodiments, the i-th signal line SLi may be connected to the control signal pad P53 by the (i−2)-th first selection signal LSELi-2 and connected to the sensing pad P51 by the i-th first selection signal LSELi. In this case, the first shift register array 510 may output the first selection signals LSEL-1 to LSELk.

In some exemplary embodiments, a plurality of switching transistors A1 to Ak in the main multiplexer 520a, a plurality of switching transistors B1 to Bk in the discharge multiplexer 520b, and the plurality of switching transistors C1 to Ck in the pre-charge multiplexer 520c are composed of PMOS transistors, but exemplary embodiments are not limited thereto. For example, the switching transistors A1 to Ak, the switching transistors B1 to Bk, and the switching transistors C1 to Ck may all be NMOS transistors. It is also contemplated that some may be PMOS transistors and some may be NMOS transistors.

Figure 18:
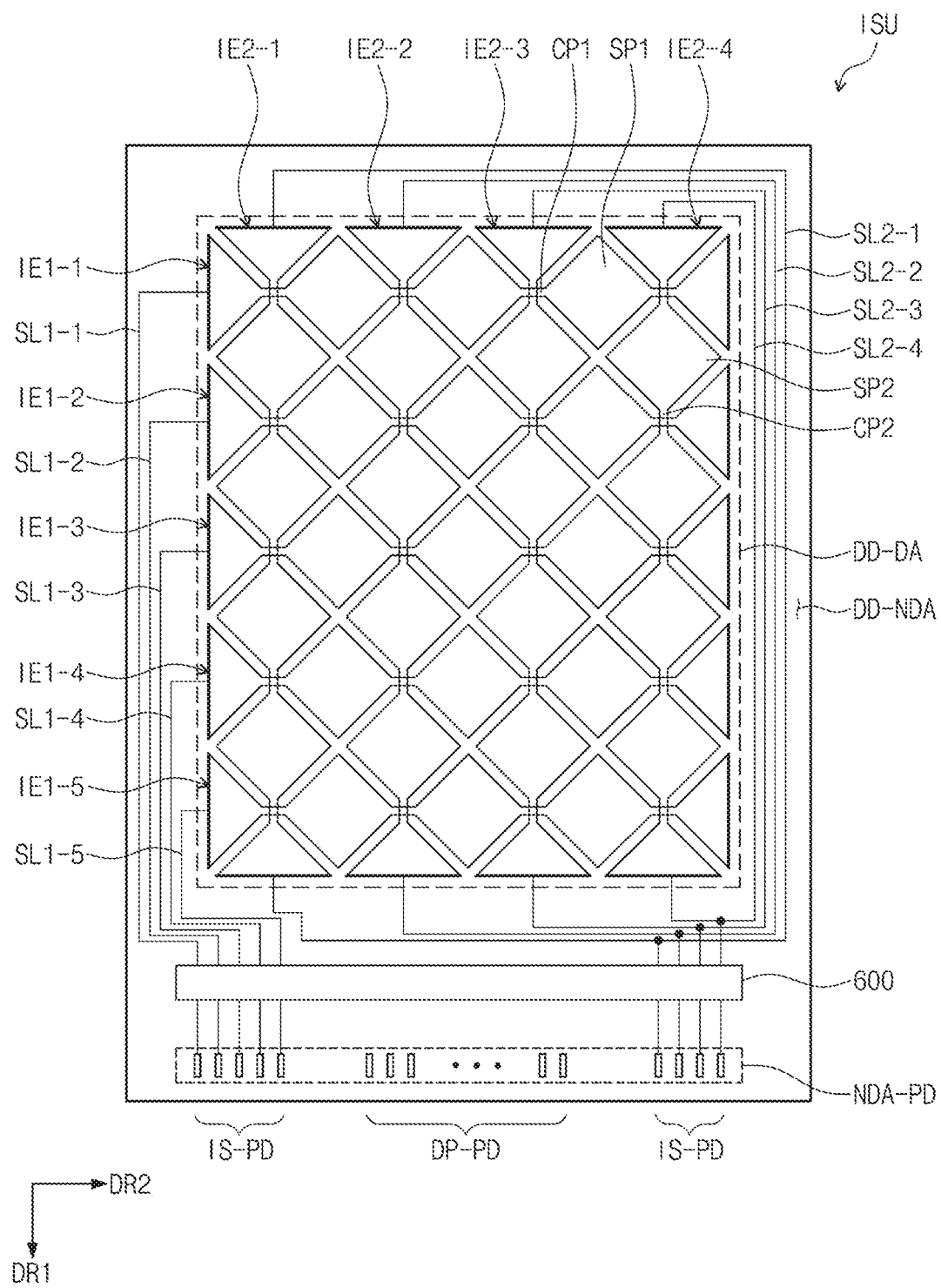
FIG. 18 is a plan view of an input sensing unit according to some exemplary embodiments.

FIG. 18 is a plan view of an input sensing unit according to some exemplary embodiments.

Referring to FIG. 18, an input sensing unit ISU may include first sensing electrodes IE1-1 to IE1-5, first signal lines SL1-1 to SL1-5 connected to the first sensing electrodes IE1-1 to IE1-5, second sensing electrodes IE2-1 to IE2-4, and second signal lines SL2-1 to SL2-4 connected to the second sensing electrodes IE2-1 to IE2-4.

The first sensing electrodes IE1-1 to IE1-5 and the second sensing electrodes IE2-1 to IE2-4 cross each other. The first sensing electrodes IE1-1 to IE1-5 are arranged (e.g., spaced apart from one another) in a first direction DR1 and each have a shape extending in a second direction DR2. The input sensing unit ISU may detect external inputs by a mutual capacitance method and/or a self-capacitance method. After calculating (or determining) the coordinates of the mutual capacitance method of an external input during the first section, the input sensing unit ISU may recalculate the coordinates of the external input in a self-capacitance manner during the second section T2.

Each of the first sensing electrodes IE1-1 to IE1-5 includes first sensor parts SP1 and first connection parts CP1. Each of the second sensing electrodes IE2-1 to IE2-4 includes second sensor parts SP2 and second connection parts CP2. The two first sensor parts SP1 disposed at both ends of the first sensing electrodes IE1-1 to IE1-5 among the first sensor parts SP1 may have a smaller size, for example, a half size, as compared to the first sensor parts SP1 disposed at the center or central region of the first sensing electrodes IE1-1 to IE1-5. The two second sensor parts SP2 disposed at both ends of the second sensing electrodes IE2-1 to IE2-4 among the second sensor parts SP2 may have a smaller size, for example, a half size, as compared to the second sensor part SP2 disposed at the center or central region of the second sensing electrodes IE2-1 to IE2-4.

Although FIG. 18 shows the first sensing electrodes IE1-1 to IE1-5 and the second sensing electrodes IE2-1 to IE2-4 having a particular shape, their shapes are not limited thereto. In some exemplary embodiments, the first sensing electrodes IE1-1 to IE1-5 and the second sensing electrodes IE2-1 to IE2-4 may have a shape (for example, a bar shape) without distinguishing between the sensor part and the connection part. In other words, the first sensor parts SP1 and the second sensor parts SP2 in the form of rhombus shapes are illustrated by way of example, but are not limited thereto. The first sensor parts SP1 and second sensor parts SP2 may have another polygonal shape.

Within one first sensing electrode among the first sensing electrodes IE1-1 to IE1-5, the first sensor parts SP1 are aligned along a second direction DR2, and within one second sensing electrode among the second sensing electrodes IE2-1 to IE2-4, the second sensor parts SP2 are aligned along a first direction DR1. Each of the first connection parts CP1 connects adjacent first sensor parts SP1 and each of the second connection parts CP2 connects adjacent second sensor parts SP2.

The first signal lines SL1-1 to SL1-5 are connected to one ends of the first sensing electrodes IE1-1 to IE1-5, respectively. The second signal lines SL2-1 to SL2-4 are connected to both ends of the second sensing electrodes IE2-1 to IE2-4. In some exemplary embodiments, the first signal lines SL1-1 to SL1-5 may also be connected to both ends of the first sensing electrodes IE1-1 to IE1-5. In some exemplary embodiments, the second signal lines SL2-1 to SL2-4 may be connected to only one end of the second sensing electrodes IE2-1 to IE2-4, respectively.

According to some exemplary embodiments, as compared to the input sensing unit ISU including the second signal lines SL2-1 to SL2-4 connected to only one end of the second sensing electrodes IE2-1 to IE2-4, the sensing sensitivity may be improved. Since the second sensing electrodes IE2-1 to IE2-4 may be longer than the first sensing electrodes IE1-1 to IE1-5, a voltage drop of the sensing signal (or transmission signal) may occur, and, accordingly, the sensing sensitivity may be deteriorated. According to some exemplary embodiments, since it provides a sensing signal (or transmission signal) through the second signal lines SL2-1 to SL2-4 connected to both ends of the second sensing electrodes IE2-1 to IE2-4, it is possible to prevent (or at least reduce) the voltage drop of the sensing signal (or the transmission signal) and prevent (or at least reduce) the sensing sensitivity from being lowered.

The input sensing unit ISU may include signal pads DP-PD and input sensing pads IS-PD. The signal pads DP-PD and the input sensing pads IS-PD may be aligned in the pad area NDA-PD, e.g., aligned in the second direction DR2.

The switching circuit 600 is disposed in the non-display area DD-NDA. The switching circuit 600 may electrically connect the input sensing pads IS-PD to the first signal lines SL1-1 to SL1-5 and the second signal lines SL2-1 to SL2-4.

Figure 19:
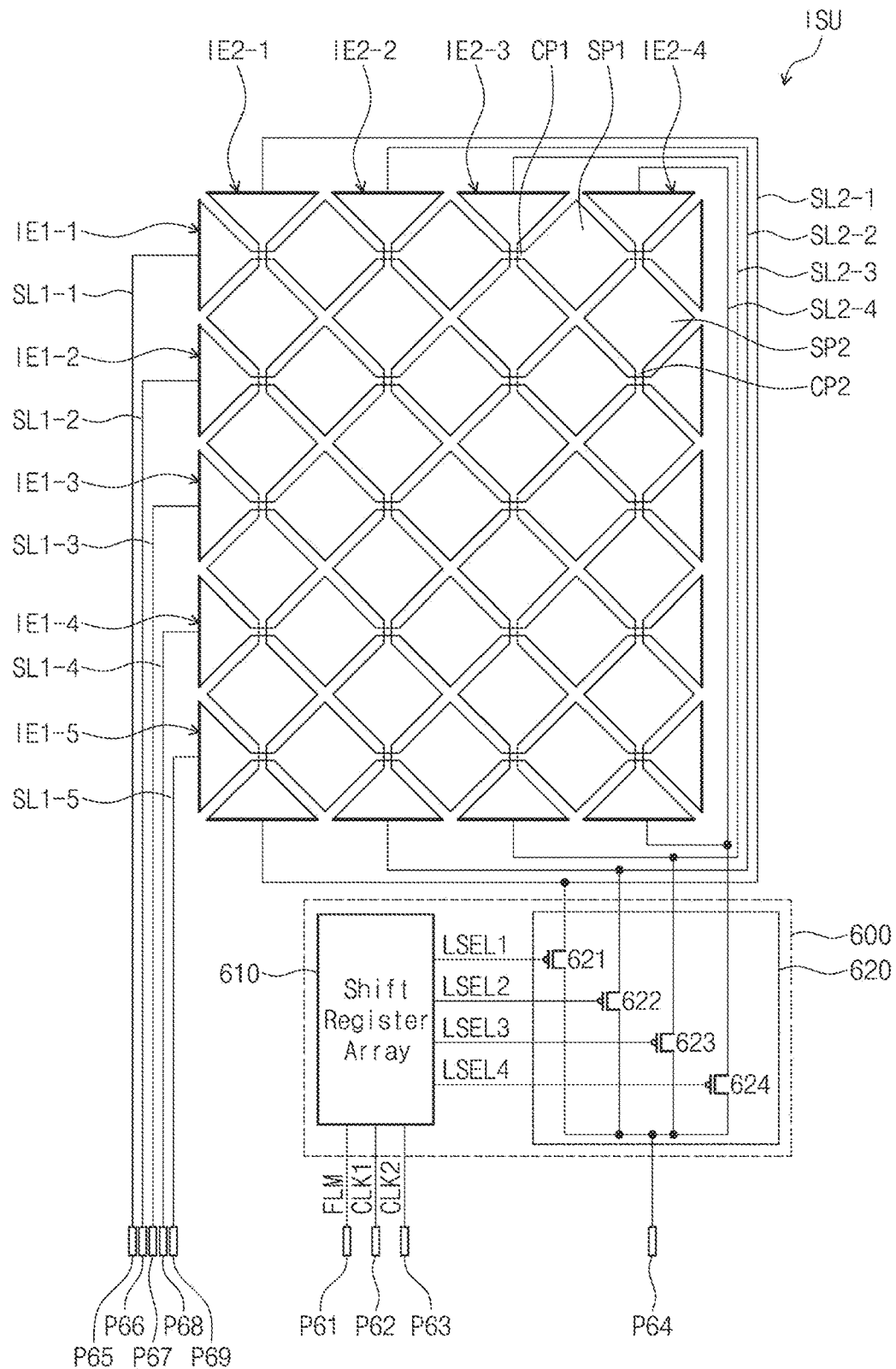
FIG. 19 is a circuit diagram of a switching circuit of an input sensing unit according to some exemplary embodiments.

FIG. 19 is a circuit diagram of a switching circuit of an input sensing unit according to some exemplary embodiments.

Referring to FIG. 19, the switching circuit 600 of the input sensing unit ISU includes a shift register array 610 and a multiplexer 620. The shift register array 610 receives the start signal FLM from the control signal pad P61, the first clock signal CLK1 from the control signal pad P62, and the second clock signal CLK2 from the control signal pad P63.

The shift register array 610 outputs the first selection signals LSEL1 to LSEL4. In some exemplary embodiments, the shift register array 610 may sequentially activate the first selection signals LSEL1 to LSEL4 to a first level (e.g., a low level). The circuit configuration and operation of the shift register array 610 may be similar to the shift register array 110 shown in FIGS. 7 and 8.

The multiplexer 620 electrically connects any one of the second signal lines SL2-1 to SL2-4 to the sensing pad P64 in response to the first selection signals LSEL1 to LSEL4. The multiplexer 620 includes switching transistors 621 to 624.

The switching transistor 621 includes a first electrode connected to the corresponding second signal line SL2-1, a second electrode connected to the sensing pad P64, and a gate electrode receiving the first selection signal LSEL1.

The switching transistor 622 includes a first electrode connected to the corresponding second signal line SL2-2, a second electrode connected to the sensing pad P64, and a gate electrode receiving the first selection signal LSEL2.

The switching transistor 623 includes a first electrode connected to the corresponding second signal line SL2-3, a second electrode connected to the sensing pad P64, and a gate electrode receiving the first selection signal LSEL3.

The switching transistor 624 includes a first electrode connected to the corresponding second signal line SL2-4, a second electrode connected to the sensing pad P64, and a gate electrode receiving the first selection signal LSEL4.

As seen in FIG. 19, the switching transistors 621 to 624 are composed of PMOS transistors, but exemplary embodiments are not limited thereto. In some exemplary embodiments, the switching transistors 621 to 624 may be composed of NMOS transistors. When the switching transistors 621 to 624 are composed of PMOS transistors, the activation section of the first selection signals LSEL1 to LSEL4 may be in a low level, and when the switching transistors 621 to 624 are composed of NMOS transistors, the activation section of the first selection signals LSEL1 to LSEL4 may be in a high level.

Figure 20:
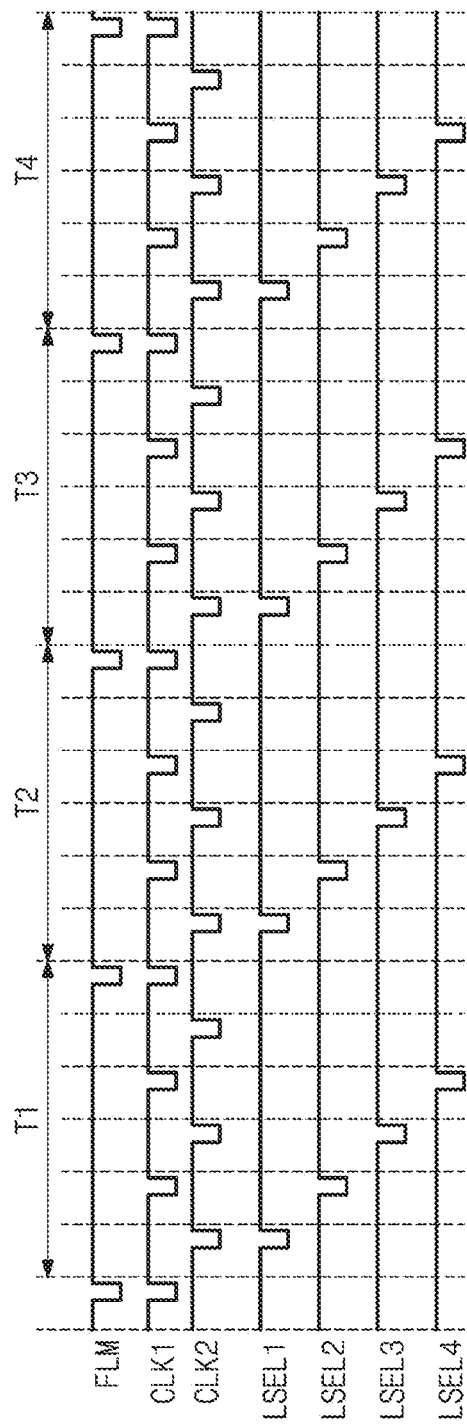
FIG. 20 is a timing diagram for explaining an operation of an input sensing unit according to some exemplary embodiments.

FIG. 20 is a timing diagram for explaining an operation of an input sensing unit according to some exemplary embodiments.

Referring to FIGS. 19 and 20, the start signal FLM is a signal indicating the driving start of each of the second sensing electrode IE2-1 to IE2-4. The first section T1 is the operation section of the second sensing electrode IE2-1, the second section T2 is the operation section of the second sensing electrodes IE2-2, the third section T3 is the operation section of the second sensing electrode IE2-3, and the fourth section T4 is the operation section of the second sensing electrode IE2-4.

The first clock signal CLK1 and the second clock signal CLK2 have the same period and are different in phase. The first selection signals LSEL1 to LSEL4 output from the shift register array 610 are signals for sequentially selecting the second signal lines SL2-1 to SL2-4. For example, when the first selection signals LSEL1 to LSEL4 are sequentially activated to a low level, as the switching transistors 621 to 624 are sequentially turned on, the second signal lines SL2-1 to SL2-4 may be electrically connected to the sensing pad P64 sequentially. Therefore, the driving signal of the sensing pad P64 may be sequentially provided from the input sensing circuit IS-C (shown in FIGS. 3A and 3B) to the second sensing electrodes IE2-1 to IE2-4. In addition, the sensing signals from the second sensing electrodes IE2-1 to IE2-4 may be provided to the input sensing circuit IS-C sequentially through the sensing pad P64.

In some exemplary embodiments, the switching circuit 600 of the input sensing unit ISU further includes a masking circuit 270 as shown in FIG. 9 so that only some of the second sensing electrodes IE2-1 to IE2-4 may be controlled to operate.

In some exemplary embodiments, the multiplexer 620 in the switching circuit 600 of the input sensing unit ISU further includes the discharge multiplexer 420b shown in FIG. 14A so that when the second signal lines SL2-1 to SL2-4 are not connected to the sensing pad (not shown) of the input sensing pads IS-PD, it may discharge the second signal lines SL2-1 to SL2-4 at the second voltage VGL.

In some exemplary embodiments, the multiplexer 620 in the switching circuit 600 of the input sensing unit ISU further includes the discharge multiplexer 520b and the pre-charge multiplexer 520c shown in FIG. 16A so that when the second signal lines SL2-1 to SL2-4 are not connected to the sensing pad (not shown) of the input sensing pads IS-PD, it may discharge the second signal lines SL2-1 to SL2-4 at the second voltage VGL. In addition, The i-th second signal line SL2-i of the second signal lines SL2-1 to SL2-4 may be pre-charged at the third voltage VDRV by the (i−1)-th first selection signal LSELi-1.

FIGS. 21 to 25 are plan views of an input sensing unit according to various exemplary embodiments.

Figure 21:
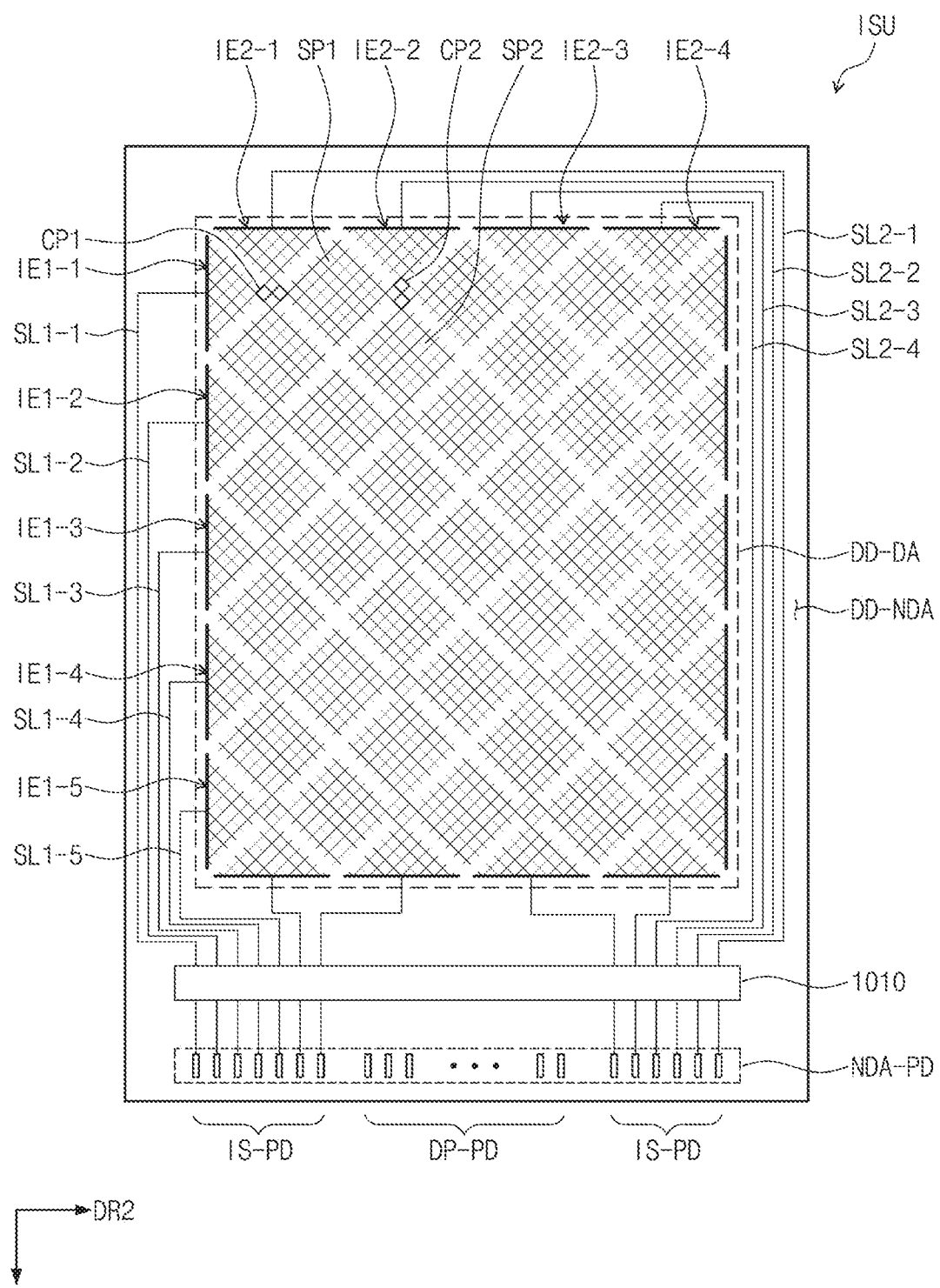
FIG. 21 is a plan view of an input sensing unit according to some exemplary embodiments.

Referring to FIG. 21, the first sensing electrodes IE1-1 to IE1-5 and the second sensing electrodes IE2-1 to IE2-4 of the input sensing unit ISU may have a mesh shape. The first sensing electrodes IE1-1 to IE1-5 and the second sensing electrodes IE2-1 to IE2-4 have a mesh shape so that parasitic capacitance with respect to the electrodes of the display panel DP (see FIG. 3A) may be reduced.

The first sensing electrodes IE1-1 to IE1-5 and the second sensing electrodes IE2-1 to IE2-4 in a mesh form may include, for instance, at least one of silver, aluminum, copper, chromium, nickel, titanium, and the like, which may be available for low-temperature processes, but are not limited to. Even if the input sensing unit ISU is formed by a continuous process as previously described, damage to the organic light emitting diodes of the pixels PX (see, e.g., FIGS. 3A and 3B) may be prevented.

The switching circuit 1010 of the input sensing unit ISU is disposed in the non-display area DD-NDA. The switching circuit 1010 may electrically connect the input sensing pads IS-PD to the first signal lines SL1-1 to SL1-5 and the second signal lines SL2-1 to SL2-4.

The switching circuit 1010 of the input sensing unit ISU may have the same circuit configuration as the switching circuit 600 shown in FIG. 19.

In some exemplary embodiments, the switching circuit 1010 of the input sensing unit ISU further includes a masking circuit 270 as shown in FIG. 9 so that only some of the second sensing electrodes IE2-1 to IE2-4 may be controlled to operate.

In some exemplary embodiments, the switching circuit 1010 of the input sensing unit ISU further includes the discharge multiplexer 420b shown in FIG. 14A so that when the second signal lines SL2-1 to SL2-4 are not connected to the sensing pad (not shown) of the input sensing pads IS-PD, it may discharge the second signal lines SL2-1 to SL2-4 at the second voltage VGL.

In some exemplary embodiments, the switching circuit 1010 of the input sensing unit ISU further includes the discharge multiplexer 520b and the pre-charge multiplexer 520c shown in FIG. 16A so that when the second signal lines SL2-1 to SL2-4 are not connected to the sensing pad (not shown) of the input sensing pads IS-PD, it may discharge the second signal lines SL2-1 to SL2-4 at the second voltage VGL. In addition, The i-th second signal line SL2-i of the second signal lines SL2-1 to SL2-4 may be pre-charged at the third voltage VDRV by the (i–1)-th first selection signal LSELi-1.

Figure 22:
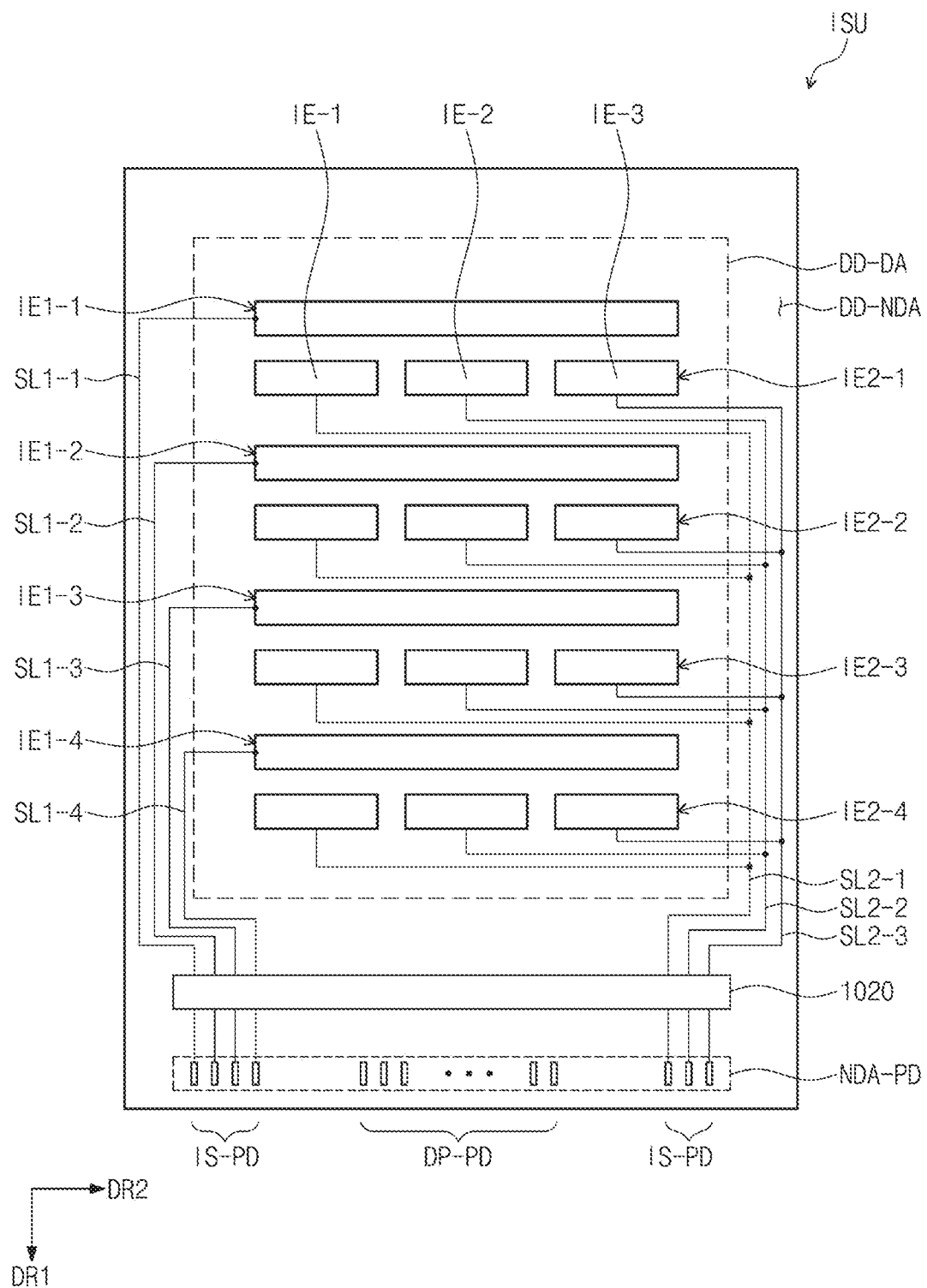
FIG. 22 is a plan view of an input sensing unit according to some exemplary embodiments.

Referring to FIG. 22, the input sensing unit ISU may include first sensing electrodes IE1-1 to IE1-4, first signal lines SL1-1 to SL1-4 connected to the first sensing electrodes IE1-1 to IE1-4, second sensing electrodes IE2-1 to IE2-4, second signal lines SL2-1 to SL2-3 connected to the second sensing electrodes IE2-1 to IE2-4, and a switching circuit 1020. The driving method of the input sensing unit ISU is not particularly limited, and an external input may be detected by a mutual capacitance method and/or a self-capacitance method.

Each of the first sensing electrodes IE1-1 to IE1-4 has a shape extending in the second direction DR2. The first sensing electrodes IE1-1 to IE1-4 are arranged in a first direction DR1. The second sensing electrodes IE2-1 to IE2-4 are alternately arranged with the first sensing electrodes IE1-1 to IE1-4. The second sensing electrodes IE2-1 to IE2-4 include a plurality of sensor parts IE-1 to IE-3. The second sensing electrodes IE2-1 to IE2-4 including three sensor parts IE-1 to IE-3 arranged and spaced in a second direction DR2 are exemplarily shown, but exemplary embodiments are not limited thereto.

The second signal lines SL2-1 to SL2-3 electrically connect the corresponding sensor parts IE-1 to IE-3 of the second sensing electrodes IE2-1 to IE2-4. The first sensor parts IE-1 of the second sensing electrodes IE2-1 to IE2-4 are connected to the second signal line SL2-1 of the second signal lines SL2-1 to SL2-3. The second sensor parts IE-2 of the second sensing electrodes IE2-1 to IE2-4 are connected to the second signal line SL2-2 of the second signal lines SL2-1 to SL2-3. The third sensor parts IE-3 of the second sensing electrodes IE2-1 to IE2-4 are connected to the second signal line SL2-3 of the second signal lines SL2-1 to SL2-3.

The switching circuit 1020 of the input sensing unit ISU is disposed in the non-display area DD-NDA. The switching circuit 1020 may electrically connect the input sensing pads IS-PD to the first signal lines SL1-1 to SL1-4 and the second signal lines SL2-1 to SL2-3.

The switching circuit 1020 of the input sensing unit ISU may have a circuit configuration similar to those of the switching circuit 100 shown in FIG. 5, the switching circuit 200 shown in FIG. 9, the switching circuit 300 shown in FIG. 12, the switching circuit 400 shown in FIG. 14A, the switching circuit 500 shown in FIG. 16A, and the switching circuit 600 shown in FIG. 19.

Figure 23:
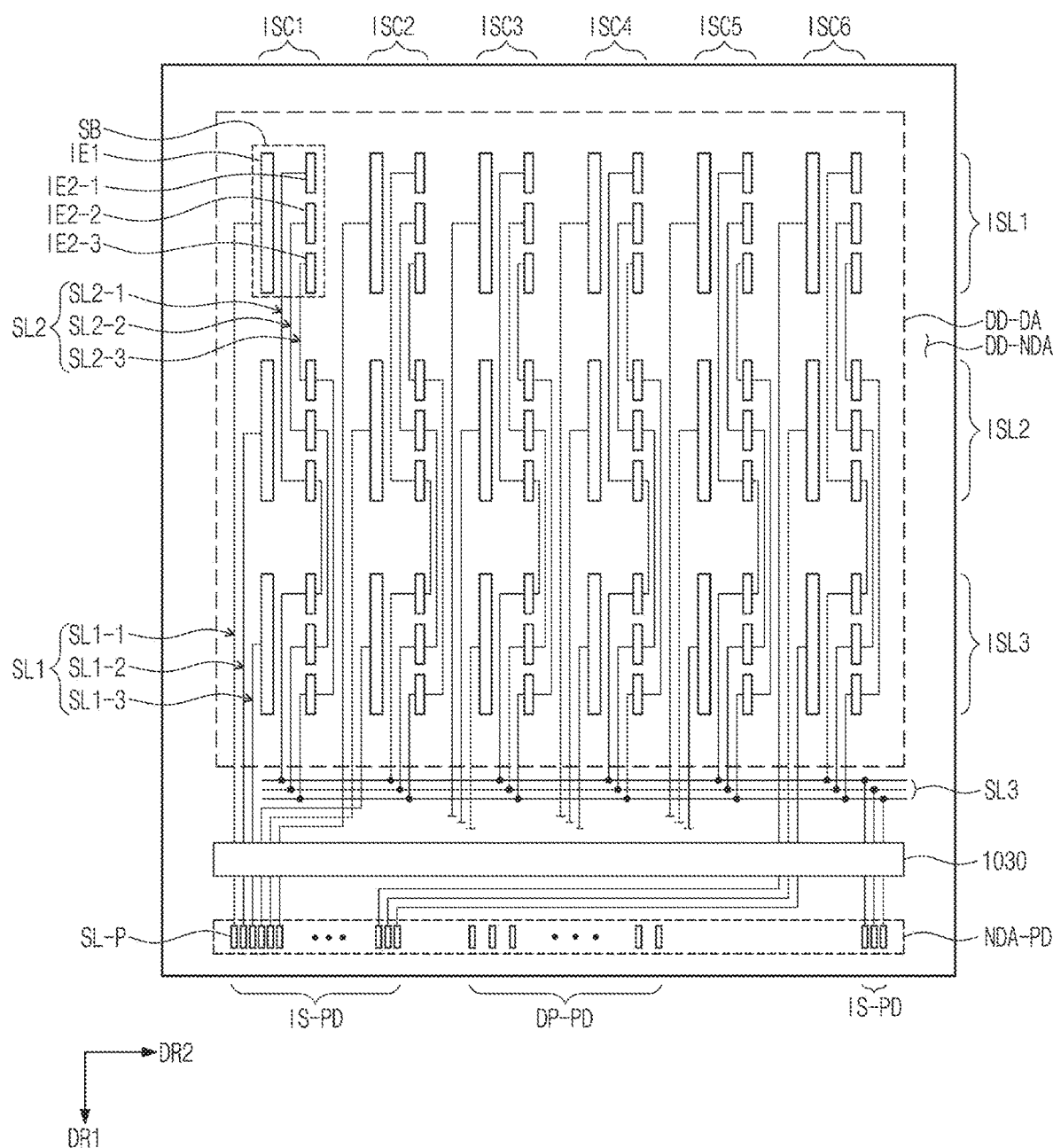
FIG. 23 is a plan view of an input sensing unit according to some exemplary embodiments.

Referring to FIG. 23, the input sensing unit ISU includes first sensing electrodes IE1, second sensing electrodes IE2-1 to IE2-3, signal lines SL1 to SL3, and a switching circuit 1030. The input sensing unit ISU includes a plurality of sensor blocks SB disposed in the display area DD-DA. The sensor blocks SB may define a plurality of sensor columns ISC1 to ISC6 or may define a plurality of sensor rows ISL1 to ISL3. Each of the plurality of sensor columns ISC1 to ISC6 may include a plurality of sensor blocks SB arranged in a column direction (e.g., the first direction DR1 in FIG. 23). The plurality of sensor columns ISC1 to ISC6 are arranged in the row direction (e.g., the second direction DR2 in FIG. 23). Although a plurality of sensor blocks SB arranged in a matrix form are shown in FIG. 23, exemplary embodiments are not limited thereto.

The switching circuit 1030 of the input sensing unit ISU is disposed in the non-display area DD-NDA. The switching circuit 1030 may electrically connect the input sensing pads IS-PD and the signal lines SL1 to SL3.

The switching circuit 1030 of the input sensing unit ISU may have a circuit configuration similar to those of the switching circuit 100 shown in FIG. 5, the switching circuit 200 shown in FIG. 9, the switching circuit 300 shown in FIG. 12, the switching circuit 400 shown in FIG. 14A, the switching circuit 500 shown in FIG. 16A, and the switching circuit 600 shown in FIG. 19.

Figure 24:
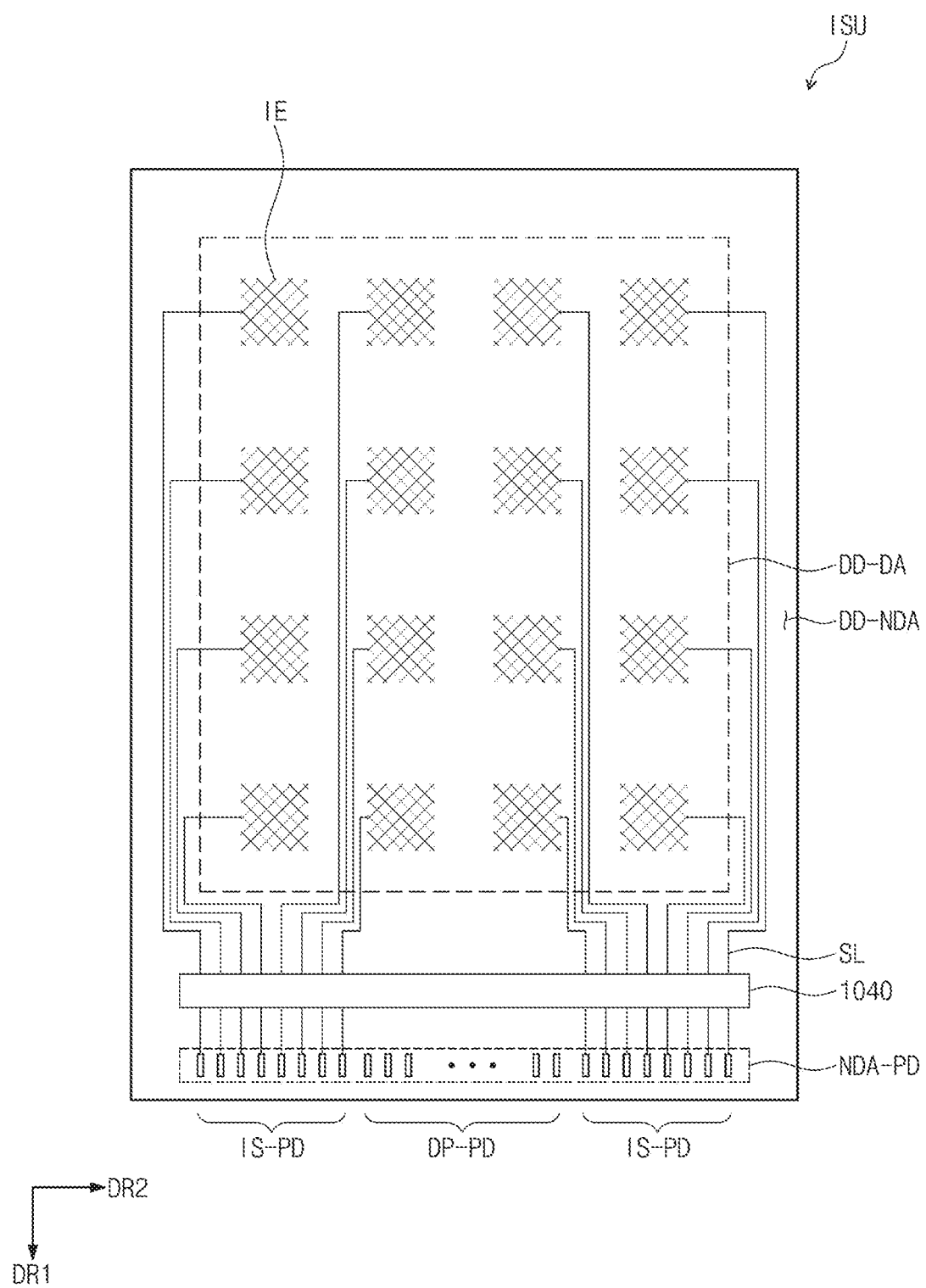
FIG. 24 is a plan view of an input sensing unit according to some exemplary embodiments.

Referring to FIG. 24, an input sensing unit ISU may include a plurality of sensing electrodes IE and a plurality of signal lines SL. The sensing electrodes IE may have a mesh shape.

The switching circuit 1040 of the input sensing unit ISU is disposed in the non-display area DD-NDA. The switching circuit 1040 may electrically connect the input sensing pads IS-PD and the signal lines SL.

The switching circuit 1040 of the input sensing unit ISU may have a circuit configuration similar to those of the switching circuit 100 shown in FIG. 5, the switching circuit 200 shown in FIG. 9, the switching circuit 300 shown in FIG. 12, the switching circuit 400 shown in FIG. 14A, the switching circuit 500 shown in FIG. 16A, and the switching circuit 600 shown in FIG. 19.

Figure 25:
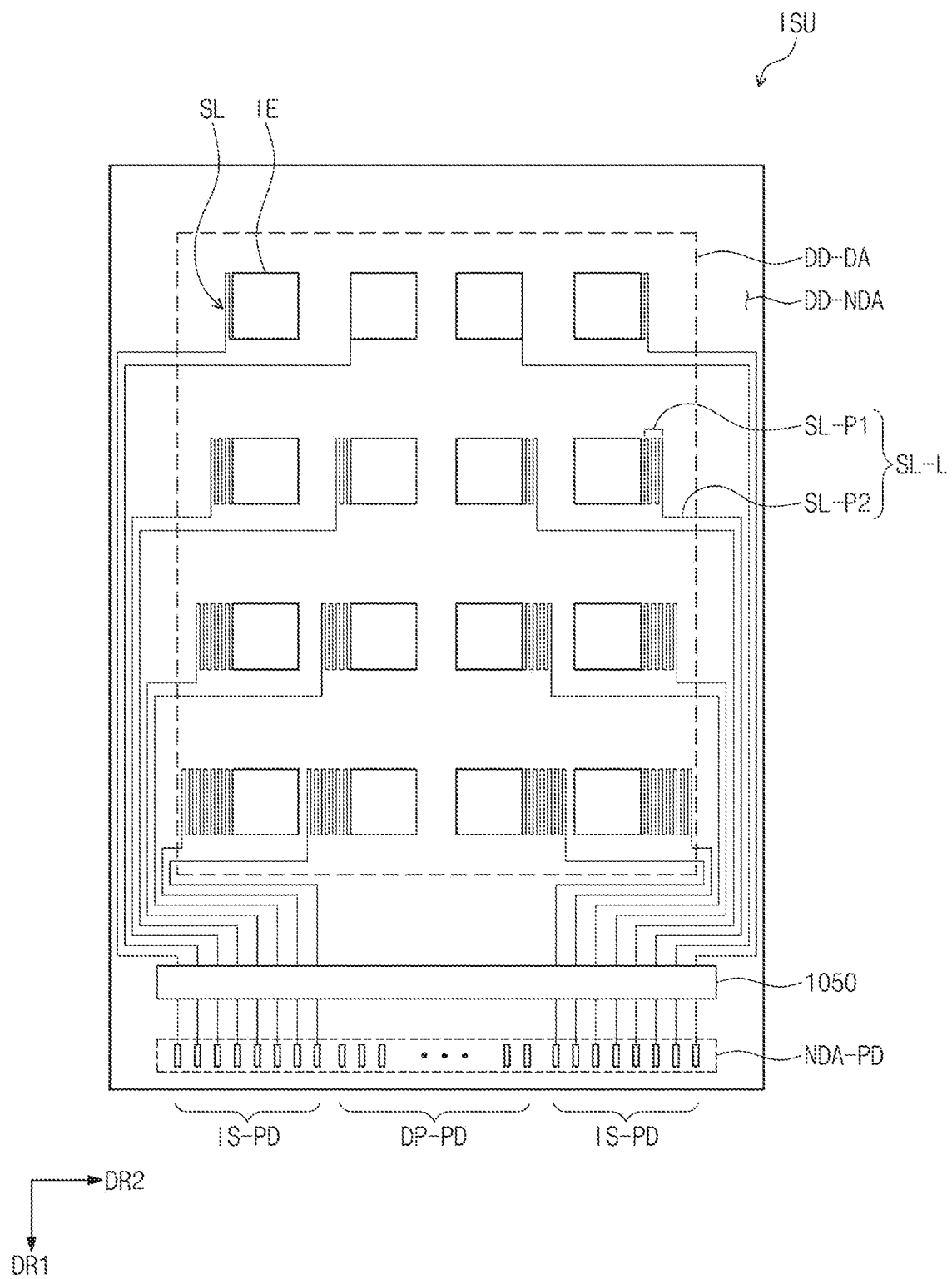
FIG. 25 is a plan view of an input sensing unit according to some exemplary embodiments.

Referring to FIG. 25, the input sensing unit ISU may include polygonal sensing electrodes IE. The distances between the sensing electrodes IE and the pad area NDA-PD may be determined by the coordinates of the sensing electrodes IE. The length of the signal lines SL may be determined according to the coordinates of connected sensing electrodes IE. In some exemplary embodiments, the signal lines SL may have the same length to control the resistance of the signal lines SL equally. The line part SL-L may include a first part SL-P1 and a second part SL-P2. One end of the first part SL-P1 is connected to a corresponding one of the sensing electrodes IE. The second part SL-P2 extends from the first part SL-P1 and a pad part SL-P (see FIG. 23) is connected to one end of the second part SL-P2.

The first part SL-P1 may be bent n times or more as a part that controls the resistance of the signal lines SL. Here, n is an integer greater than or equal to zero. It is also noted that n may be determined according to the coordinates of the sensing electrodes IE to which the signal lines SL are connected. As the sensing electrodes IE are disposed further away from the pad area NDA-PD, n becomes smaller, and as the sensing electrodes IE are disposed closer to the pad area NDA-PD, n becomes larger. The signal lines SL may have the same length when they are spread and compared.

Although the first part SL-P1 is shown as disposed in the display area DD-DA, the first part SL-P1 may be disposed in the non-display area DD-NDA. The first part SL-P1 may be disposed adjacent to the pad area NDA-PD. The first part SL-P1 may alleviate the static electricity applied from the outside. It is also contemplated that the line part SL-L may further include a third part connecting the sensing electrodes IE and the first part SL-P1 disposed in the non-display area DD-NDA.

The switching circuit 1050 of the input sensing unit ISU is disposed in the non-display area DD-NDA. The switching circuit 1050 may electrically connect the input sensing pads IS-PD and the signal lines SL.

The switching circuit 1050 of the input sensing unit ISU may have a circuit configuration similar to those of the switching circuit 100 shown in FIG. 5, the switching circuit 200 shown in FIG. 9, the switching circuit 300 shown in FIG. 12, the switching circuit 400 shown in FIG. 14A, the switching circuit 500 shown in FIG. 16A, and the switching circuit 600 shown in FIG. 19.

According to various exemplary embodiments, a display device having a configuration as previously described may connect a sensing signal of a plurality of sensing electrodes to a sensing pad having a number smaller than the number of sensing electrodes so that the number of sensing pads and signal lines may be reduced. Since the selection signals for controlling transistors in a multiplexer are output from a shift register array, the display device may utilize only a significantly reduced number of input sensing pads.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
   a display panel comprising a display area and a non-display area;
   an input sensing unit disposed on the display panel, the input sensing unit comprising sensing electrodes and signal lines respectively connected to the sensing electrodes;
   input sensing pads disposed in the non-display area, the input sensing pads comprising control signal pads and a sensing pad;
   a first shift register array configured to:
      receive a start signal and at least one clock signal through some of the control signal pads; and
      sequentially activate first selection signals;
   a multiplexer circuit configured to selectively connect the signal lines to the sensing pad in response to the first selection signals; and
   a second shift register array configured to receive a second start signal and at least one sub-clock signal through some of the control signal pads and to sequentially activate second selection signals,
   wherein the multiplexer circuit is configured to selectively connect the signal lines to the sensing pad in response to the first selection signals and the second selection signals.

2. The display device of claim 1, wherein:
   the first shift register array comprises shift registers configured to output a corresponding first selection signal among the first selection signals in response to a first input signal, a first clock signal, and a second clock signal;
   the first input signal of a 1-th shift register among the shift registers is a start signal; and
   the first input signal of an i-th shift register among the shift registers is a first selection signal output from an (i−1)-th shift register (i being a positive integer greater than one).

3. The display device of claim 2, wherein the first clock signal and the second clock signal have a same period and different phases.

4. The display device of claim 1, wherein:
   the sensing electrodes are divided into sensing electrode groups; and
   the multiplexer circuit comprises:
      first multiplexers respectively corresponding to the sensing electrode groups, each of the first multiplexers comprising an output node and being configured to electrically connect the output node to a signal line connected to a corresponding sensing electrode in a corresponding sensing electrode group among the sensing electrode groups in response to a corresponding first selection signal among the first selection signals; and
      a second multiplexer configured to connect the output node of a first multiplexer among the first multiplexers to the sensing pad in response to a third selection signal among third selection signals received through some of the control signal pads.

5. The display device of claim 4, wherein:
   each of the first multiplexers comprises switching transistors respectively corresponding to sensing electrodes in a corresponding sensing electrode group among the sensing electrode groups; and
   each of the switching transistors comprises a first electrode connected to a signal line connected to the corresponding sensing electrode, a second electrode connected to the output node, and a gate electrode configured to receive a corresponding first selection signal among the first selection signals.

6. The display device of claim 4, wherein:
   the second multiplexer comprises switching transistors respectively corresponding to the first multiplexers; and
   each of the switching transistors comprises a first electrode connected to the output node of a corresponding first multiplexer among the first multiplexers, a second electrode connected to the sensing pad, and a gate electrode configured to receive a corresponding third selection signal among the third selection signals.

7. The display device of claim 4, wherein:
   each of the first multiplexers further comprises a masking circuit configured to output internal selection signals from the first shift register array, the internal selection signals being configured to maintain some of the first selection signals at an inactive level; and
   the multiplexer circuit is configured to selectively connect the signal lines to the sensing pad in response to the internal selection signals.

8. The display device of claim 7, wherein the masking circuit comprises:
   output switching transistors respectively corresponding to the first selection signals, each of the output switching transistors comprising a first electrode connected to a corresponding first selection signal among the first selection signals, a second electrode, and a gate electrode configured to receive an output control signal from a control signal pad among the control signal pads; and output enable transistors respectively corresponding to the output switching transistors, each of the output enable transistors comprising a first electrode configured to receive a first voltage from a first voltage pad among the control signal pads, a second electrode connected to the second electrode of a corresponding output switching transistor among the output switching transistors, and a gate electrode configured to receive an output enable signal from a control signal pad among the control signal pads.

9. The display device of claim 7, wherein:
the display device is configured to operate in a masking mode and a slow mode; and
a frequency of the at least one clock signal in the slow mode is lower than a frequency of the at least one clock signal in the masking mode.

10. The display device of claim 9, wherein the masking circuit is configured to output the first selection signals as the internal selection signals during the slow mode.

11. The display device of claim 4, wherein:
the multiplexer circuit is further configured to receive a second voltage and a third voltage respectively through a second voltage pad and a third voltage pad among the control signal pads; and
each of the first multiplexers comprises:
a main multiplexer respectively corresponding to a sensing electrode group among the sensing electrode groups and being configured to electrically connect a signal line connected to a corresponding sensing electrode in the corresponding sensing electrode group to the output node in response to a corresponding first selection signal among the first selection signals;
a pre-charge multiplexer respectively corresponding to a sensing electrode group among the sensing electrode groups and being configured to electrically connect a signal line connected to a corresponding sensing electrode in the corresponding sensing electrode group to the third voltage pad in response to a corresponding first selection signal among the first selection signals; and
a discharge multiplexer respectively corresponding to a sensing electrode group among the sensing electrode groups and being configured to electrically connect a signal line connected to a corresponding sensing electrode in the corresponding sensing electrode group to the second voltage pad in response to a corresponding second selection signal among the second selection signals.

12. The display device of claim 11, wherein:
the main multiplexer comprises first switching transistors respectively corresponding to sensing electrodes in the corresponding sensing electrode group; and
each of the first switching transistors comprises a first electrode connected to a corresponding sensing electrode among the corresponding sensing electrode group, a second electrode connected to the output node, and a gate electrode configured to receive a corresponding first selection signal among the first selection signals.

13. The display device of claim 12, wherein:
the pre-charge multiplexer comprises second switching transistors respectively corresponding to sensing electrodes in the corresponding sensing electrode group; and
each of the second switching transistors comprises a first electrode connected to a corresponding sensing electrode, a second electrode connected to the third voltage pad, and a gate electrode configured to receive a corresponding first selection signal among the first selection signals.

14. The display device of claim 13, wherein:
the gate electrode of an i-th first switching transistor (i being a positive integer) among the first switching transistors is configured to receive an i-th first selection signal among the first selection signals; and
the gate electrode of an i-th second switching transistor among the second switching transistors is configured to receive an (i−1)-th first selection signal among the first selection signals.

15. The display device of claim 11, wherein:
the discharge multiplexer comprises third switching transistors respectively corresponding to sensing electrodes in the corresponding sensing electrode group; and
each of the third switching transistors comprises a first electrode connected to a corresponding sensing electrode among the corresponding sensing electrode group, a second electrode connected to the second voltage pad, and a gate electrode configured to receive a corresponding second selection signal among the second selection signals.

16. The display device of claim 15, wherein an activation section of an i-th second selection signal (i being a positive integer) among the second selection signals does not overlap a first activation section of an (i−1)-th first selection signal among the first selection signals and does not overlap a second activation section of an i-th first selection signal among the first selection signals.

17. The display device of claim 1, wherein:
the sensing electrodes are divided into a plurality of sensing electrode groups; and
the multiplexer circuit comprises:
first multiplexers respectively corresponding to the sensing electrode groups, each of the first multiplexers comprising an output node and being configured to electrically connect a corresponding sensing electrode in a corresponding sensing electrode group among the sensing electrode groups to the output node in response to a corresponding first selection signal among the first selection signals; and
a second multiplexer configured to connect a first multiplexer among the first multiplexers to the sensing pad in response to a corresponding second selection signal among the second selection signals.

18. A display device comprising:
a display panel comprising a display area and a non-display area;
an input sensing unit disposed on the display panel, the input sensing unit comprising sensing electrodes and signal lines respectively connected to the sensing electrodes;
input sensing pads disposed in the non-display area, the input sensing pads comprising control signal pads and a sensing pad;
a first shift register array configured to:
receive a start signal and at least one clock signal through some of the control signal pads; and sequentially activate first selection signals;
a multiplexer circuit configured to selectively connect the signal lines to the sensing pad in response to the first selection signals; and
a second shift register array configured to receive a second start signal and at least one sub-clock signal through some of the control signal pads and to sequentially activate discharge selection signals;
wherein the multiplexer circuit is configured to:
selectively connect the signal lines to the sensing pad in response to the first selection signals; and
selectively connect the signal lines to a second voltage pad configured to receive a second voltage among the control signal pads in response to the discharge selection signals.

19. The display device of claim 18, wherein:
the sensing electrodes are divided into a plurality of sensing electrode groups; and
wherein the multiplexer circuit comprises:
first multiplexers respectively corresponding to the sensing electrode groups, each of the first multiplexers comprising an output node and being configured to electrically connect a corresponding sensing electrode in a corresponding sensing electrode group among the sensing electrode groups to the output node in response to a corresponding first selection signal among the first selection signals;
a second multiplexer being configured to connect a first multiplexer among the first multiplexers to the sensing pad in response to a second selection signal among second selection signals received through some of the control signal pads; and
third multiplexers respectively corresponding to the sensing electrode groups, each of the third multiplexers being configured to electrically connect a signal line connected to a corresponding sensing electrode in a corresponding sensing electrode group among the sensing electrode groups to the second voltage pad in response to a corresponding discharge selection signal among the discharge selection signals.

20. The display device of claim 18, wherein:
the at least one clock signal and the at least one sub-clock signal have a same period; and
an activation section of the at least one sub-clock signal is longer than an activation section of the at least one clock signal.

21. A method of driving a display device comprising a display panel; an input sensing unit disposed on the display panel, the input sensing unit comprising sensing electrodes and signal lines respectively connected to the sensing electrodes; and pads comprising control signal pads and a sensing pad, the method comprising:

receiving a start signal and at least one clock signal through some of the control signal pads;
receiving a second start signal and at least one sub-clock signal through some of the control signal pads;
sequentially activating first selection signals;
sequentially activating second selection signals;
selectively connecting the signal lines to the sensing pad in response to the first selection signals and the second selection signals,
wherein the selectively connecting comprises:
electrically connecting an output node of a first multiplexer circuit to a signal line connected to a corresponding sensing electrode in a corresponding sensing electrode group among a plurality of sensing electrode groups in response to a corresponding first selection signal among the first selection signals; and
electrically connecting the output node of the first multiplexer circuit to the sensing pad in response to a second selection signal among the second selection signals received through some of the control signal pads.

22. A display device comprising:
a display panel comprising a display area and a non-display area;
an input sensing unit disposed on the display panel, the input sensing unit comprising a first sensing electrodes, a second sensing electrodes, a first signal lines respectively connected to the first sensing electrodes, and a second signal lines respectively connected to the second sensing electrodes;
input sensing pads disposed in the non-display area, the input sensing pads comprising control signal pads, a first sensing pad, and a second sensing pad;
a first shift register array configured to:
receive a start signal and at least one clock signal through some of the control signal pads; and
sequentially activate first selection signals;
a multiplexer circuit configured to selectively connect the first signal lines and the second signal lines to the input sensing pads in response to the first selection signals; and
a second shift register array configured to receive a second start signal and at least one sub-clock signal through some of the control signal pads and to sequentially activate second selection signals,
wherein the multiplexer circuit is configured to selectively connect the first signal lines to the first sensing pad and the second signal lines to the second sensing pad in response to the first selection signals and the second selection signals.

* * * * *